(12) United States Patent
Yun et al.

(10) Patent No.: US 11,532,789 B2
(45) Date of Patent: Dec. 20, 2022

(54) ORGANIC THIN FILM INCLUDING SEMICONDUCTING POLYMER AND ELASTOMER CONFIGURED TO BE DYNAMIC INTERMOLECULAR BONDED WITH A METAL-COORDINATION BOND AND ORGANIC SENSOR AND ELECTRONIC DEVICE INCLUDING THE SAME

(71) Applicants: Samsung Electronics Co., Ltd., Suwon-si (KR); THE BOARD OF TRUSTEES OF THE LELAND STANFORD JUNIOR UNIVERSITY, Stanford, CA (US)

(72) Inventors: Youngjun Yun, Yongin-si (KR); Donghee Son, Stanford, CA (US); Jin Young Oh, Stanford, CA (US); Zhenan Bao, Stanford, CA (US); Toru Katsumata, Stanford, CA (US)

(73) Assignees: Samsung Electronics Co., Ltd., Gyeonggi-do (KR); The Board of Trustees of the Leland Stanford Junior University, Stanford, CA (US)

( * ) Notice: Subject to any disclaimer, the term of this patent is extended or adjusted under 35 U.S.C. 154(b) by 862 days.

(21) Appl. No.: 16/419,420

(22) Filed: May 22, 2019

(65) Prior Publication Data

US 2019/0372005 A1 Dec. 5, 2019

Related U.S. Application Data

(60) Provisional application No. 62/677,239, filed on May 29, 2018.

(51) Int. Cl.
*H01L 51/00* (2006.01)
*C08G 61/12* (2006.01)
(Continued)

(52) U.S. Cl.
CPC ........ *H01L 51/0036* (2013.01); *C08G 61/126* (2013.01); *C08L 83/10* (2013.01);
(Continued)

(58) Field of Classification Search
CPC ............. H01L 51/0036; H01L 51/0043; H01L 51/0545; C08G 61/126; C08G 2261/124;
(Continued)

(56) References Cited

U.S. PATENT DOCUMENTS 8,440,258 B2 5/2013 Reiss et al.
9,401,487 B2 7/2016 Im et al.
(Continued)

FOREIGN PATENT DOCUMENTS

EP 2829561 A1 1/2015
JP 5100830 B2 12/2012
(Continued)

OTHER PUBLICATIONS

Li, CH., Wang, C., Keplinger, C. et al. A highly stretchable autonomous self-healing elastomer. Nature Chem 8, 618-624 (2016). https://doi.org/10.1038/nchem.2492 (Year: 2016).*
(Continued)

*Primary Examiner* — John P. Dulka
(74) *Attorney, Agent, or Firm* — Harness, Dickey & Pierce, P.L.C.

(57) ABSTRACT

Disclosed are an organic thin film including a semiconducting polymer including a ligand that is metal-coordination bondable or is metal-coordination bonded and an elastomer including a ligand that is metal-coordination bondable or is metal-coordination bonded, wherein the semiconducting polymer and the elastomer are configured to be dynamic intermolecular bonded by a metal-coordination bond, an organic sensor, and an electronic device.

25 Claims, 24 Drawing Sheets

(51) Int. Cl.
 H01L 51/05 (2006.01)
 G01B 7/16 (2006.01)
 C08L 83/10 (2006.01)
(52) U.S. Cl.
 CPC ............ *G01B 7/16* (2013.01); *H01L 51/0043* (2013.01); *H01L 51/0545* (2013.01); *C08G 2261/124* (2013.01); *C08G 2261/1412* (2013.01); *C08G 2261/18* (2013.01); *C08G 2261/228* (2013.01); *C08G 2261/3221* (2013.01); *C08G 2261/3223* (2013.01); *C08G 2261/3241* (2013.01); *C08G 2261/334* (2013.01); *C08G 2261/94* (2013.01); *C08L 2203/20* (2013.01)
(58) Field of Classification Search
 CPC ........ C08G 2261/1412; C08G 2261/18; C08G 2261/228; C08G 2261/3221; C08G 2261/3223; C08G 2261/3241; C08G 2261/334; C08G 2261/94; C08L 83/10; C08L 2203/20; G01B 7/16
 See application file for complete search history.

(56) References Cited

U.S. PATENT DOCUMENTS

| | | | |
|---|---|---|---|
| 9,761,822 | B2 | 9/2017 | Kim |
| 9,978,972 | B2 | 5/2018 | Xu |
| 10,050,203 | B2 | 8/2018 | Chung et al. |
| 10,177,326 | B2 * | 1/2019 | Chung ................. H01L 51/009 |
| 10,672,987 | B2 | 6/2020 | Chung et al. |
| 2010/0308754 | A1 | 12/2010 | Gough et al. |
| 2013/0063023 | A1 | 3/2013 | Pan et al. |
| 2013/0214249 | A1 | 8/2013 | Pan et al. |
| 2013/0226268 | A1 | 8/2013 | Pan |
| 2016/0032054 | A1 | 2/2016 | Cheng et al. |
| 2016/0240730 | A1 | 8/2016 | Murayama et al. |
| 2016/0280548 | A1 | 9/2016 | Bao et al. |
| 2017/0174842 | A1 * | 6/2017 | Wang ................. A61L 24/0031 |
| 2017/0331045 | A1 | 11/2017 | Chung et al. |
| 2017/0331057 | A1 * | 11/2017 | Chung ................. H01L 51/0036 |
| 2017/0346013 | A1 | 11/2017 | Chung et al. |
| 2018/0094106 | A1 | 4/2018 | Ma et al. |

FOREIGN PATENT DOCUMENTS

| | | |
|---|---|---|
| JP | 6168372 B2 | 7/2017 |
| KR | 101630173 B1 | 6/2016 |
| KR | 2017/0134169 A | 12/2017 |

OTHER PUBLICATIONS

Someya et al., 'An ultra-lightweight design for imperceptible plastic electronics' *Nature*, vol. 499, Jul. 2013, pp. 458-465.
Sangyul Baik et al., 'A wet-tolerant adhesive patch inspired by protuberances in suction cups of octopi' *Nature*, vol. 456, Jun. 2017, pp. 396-404.
Benjamin C.K. Tee et al., 'A skin-inspired organic digital mechanoreceptor' *Science*, vol. 350, Issue 6258, Oct. 2015, pp. 313-316.
Dae-Hyeong Kim et al., 'Epidermal Electronics' *Science*, vol. 333, Aug. 2011, pp. 838-843.
Alex Chortos et al., 'Pursuing prosthetic electronic skin' *Nature Materials*, Jul. 2016.
Jin Young Oh et al., 'Intrinsically stretchable and healable semiconducting polymer for organic transistors' *Nature*, vol. 539, Nov. 2016, pp. 411-421.
Jessy L. Baker et al., 'Quantification of Thin Film Crystallographic Orientation Using X-ray Diffraction with an Area Detector' *Langmuir*, 26(11), 2010, pp. 9146-9151.
Betty Yu et al., 'An elastic second skin' *Nature Materials*, vol. 15, Aug. 2016, pp. 911-918.

Donghee Son et al., 'Multifunctional wearable devices for diagnosis and therapy of movement disorders' *Nature Nanotechology*, vol. 9, May 2014, pp. 397-404.
Bowen Zhu et al., 'Skin-Inspired Haptic Memory Arrays with an Electrically Reconfigurable Architecture' *Advanced Materials*, vol. 28, 2016, pp. 1559-1566.
Kuniharu Takei et al., 'Nanowire active-matrix circuitry for low-voltage macroscale artificial skin' *Nature Materials*, vol. 9, Oct. 2010, pp. 821-826.
Daniela Wirthl et al., 'Instant tough bonding of hydrogels for soft machines and electronics' *Science Advances*, vol. 3, Jun. 2017, pp. e1700053.
Darren J. Lipomi et al., 'Skin-like pressure and strain sensors based on transparent elastic films of carbon nanotubes' *Nature Nanotechnology*, vol. 6, Dec. 2011, pp. 788-792.
Huichan Zhao et al., 'Optoelectronically innervated soft prosthetic hand via stretchable optical waveguides' *Science Robotics*, vol. 1, Dec. 2016, pp. eaai7529.
Daniela Rus and Michael T. Tolley, 'Design, fabrication and control of soft robots' *Nature*, vol. 521, May 2015, pp. 467-475.
J.A. Rogers et al., 'Synthesis, assembly and applications of semiconductor nanomembranes' *Nature*, vol. 477, Sep. 2011, pp. 45-53.
Kyung-In Jang et al., 'Self-assembled three dimensional network designs for soft electronics' *Nature Communications*, vol. 8:15894, Jun. 2017.
Minjeong Ha et al., 'Bioinspired Interlocked and Hierarchical Design of ZnO Nanowire Arrays for Static and Dynamic Pressure-Sensitive Electronic Skins' *Advanced Functional Materials*, vol. 25, 2015, pp. 2841-2849.
Geun Yeol Bae et al., 'Linearly and Highly Pressure-Sensitive Electronic Skin Based on a Bioinspired Hierarchical Structural Array' *Advanced Functional Materials*, vol. 28, 2016, pp. 5300-5306.
Wentao Xu et al., 'Organic core-sheath nanowire artificial synapses with femtojoule energy consumption' *Science Advances*, vol. 2:e1501326, Jun. 2016.
Toshitake Takahashi et al., 'Carbon Nanotube Active-Matrix Backplanes for Mechanically Flexible Visible Light and X-ray Imagers' *Nano Letters*, vol. 13, 2013, pp. 5425-5430.
Sungwon Lee et al., 'A transparent bending-insensitive pressure sensor' *Nature Nanotechnology*, vol. 11, May 2016, pp. 472-478.
Chuan Wang et al., 'User-interactive electronic skin for instantaneous pressure visualization' *Nature Materials*, vol. 12, Oct. 2013, pp. 899-904.
Tsuyoshi Sekitani et al., 'Organic Nonvolatile Memory Transistors for Flexible Sensor Arrays' *Science*, vol. 326, Dec. 2009, p. 1516-1519.
Jaemin Kim et al., 'A wearable multiplexed silicon nonvolatile memory array using nanocrystal charge confinement' *Science Advances*, vol. 2:e1501101, Jan. 2016.
Jonathan Viventi et al., 'Flexible, Foldable, Actively Multiplexed, High-Density Electrode Array for Mapping Brain Activity in vivo' *Nature Neuroscience*, vol. 14, No. 12, Nov. 2011, pp. 1599-1605.
Ying Yang and Marek W. Urban, 'Self-healing polymeric materials' *Chem. Soc. Rev.*, vol. 42, Mar. 2013, pp. 7446-7467.
Niels Holten-Andersen et al., 'pH-induced metal-ligand cross-links inspired by mussel yield self-healing polymer networks with near-covalent elastic moduli' *Proc. Natl. Acad. Sci.*, vol. 108, No. 7, Feb. 2011, pp. 2651-2655.
Li Yuan et al., 'Poly(phenylene oxide) modified cyanate resin for self-healing' *Polymers Advanced Technologies*, vol. 25, Mar. 2014, pp. 752-759.
Cheng-Hui Li et al., 'A highly stretchable autonomous self-healing elastomer' *Nature Chemistry*, vol. 8, Jun. 2016, pp. 618-624.
Yan Huang et al., 'A self-healable and highly stretchable supercapacitor based on a dual crosslinked polyelectrolyte' *Nature Communications*, vol. 6:10310, Dec. 2015.
Chaokun Gong et al., 'A Healable, Semitransparent Silver Nanowire-Polymer Composite Conductor' *Advanced Materials*, vol. 25, 2013, pp. 4186-4191.
Junpeng Li et al., 'Healable Capacitive Touch Screen Sensors Based on Transparent Composite Electrodes Comprising Silver Nanowires

(56) References Cited

OTHER PUBLICATIONS and a Furan/Maleimide Diels-Alder Cycloaddition Polymer' *ACS Nano*, vol. 8, No. 12, 2014, pp. 12874-12882.

Hua Wang et al., 'A Mechanically and Electrically Self-Healing Supercapacitor' *Advanced Materials*, vol. 26, 2014, pp. 3638-3643.

Amay J. Bandodkar et al., 'All-printed magnetically self-healing electrochemical devices' *Science Advances*, vol. 2:e1601465, Nov. 2016.

Tan-Phat Huynh and Hossam Haick, 'Self-Healing, Fully Functional, and Multiparametric Flexible Sensing Platform' *Advanced Materials*, vol. 28, 2016, pp. 138-143.

Philippe Cordier et al., 'Self-healing and thermoreversible rubber from supramolecular assembly' *Nature*, vol. 451, Feb. 2008, pp. 977-980.

Etienne Palleau et al., 'Self-Healing Stretchable Wires for Reconfigurable Circuit Wiring and 3D Microfluidics' *Advanced Materials*, vol. 25, 2013, pp. 1589-1592.

Zhiyuan Liu et al., 'High-Adhesion Stretchable Electrodes Based on Nanopile Interlocking' *Advanced Materials*, vol. 29, 2017, pp. 1603382.

Ging-Ji Nathan Wang et al., 'Inducing Elasticity through Oligo-Siloxane Crosslinks for Intrinsically Stretchable Semiconducting Polymers' *Advanced Functional Materials*, vol. 26, No. 40, 2016, pp. 7254-7262.

Binghua Zhou et al., 'A flexible, self-healing and highly stretchable polymer electrolyte via quadruple hydrogen bonding for lithium-ion batteries' *Journal of Materials Chemistry A*, vol. 6, 2018, pp. 11725-11733.

Rudy J. Wojtecki et al., 'Using the dynamic bond to access macroscopically responsive structurally dynamic polymers' *Nature Materials*, vol. 10, Jan. 2011, pp. 14-27.

Kaltenbrunner, M., et al., 'An ultra-lightweight design for imperceptible plastic electronics' *Nature*, vol. 499, Jul. 2013, pp. 458-463.

\* cited by examiner

ORGANIC THIN FILM INCLUDING SEMICONDUCTING POLYMER AND ELASTOMER CONFIGURED TO BE DYNAMIC INTERMOLECULAR BONDED WITH A METAL-COORDINATION BOND AND ORGANIC SENSOR AND ELECTRONIC DEVICE INCLUDING THE SAME

This application claims priority under 35 U.S.C. § 119 to U.S. Provisional Application No. 62/677,239, filed on May 29, 2018. The entire disclosure of the above-referenced application is hereby incorporated by reference.

BACKGROUND

1. Field

An organic thin film, an organic sensor, and an electronic device are disclosed.

2. Description of the Related Art

Development of flexible and stretchable electronic materials and electronic devices has led to researches on smart skin devices, soft robots, and biomedical devices similar to human skin. One of the typical functions of such a device is a sensory function that is sensitive to stimulation.

However, these devices developed to date do not simultaneously satisfy required sensing performance and stretchability.

SUMMARY

An embodiment provides an organic thin film that may simultaneously satisfy both sensing performance and stretchability.

Another embodiment provides an organic sensor that may simultaneously satisfy sensing performance and stretchability.

Another embodiment provides an electronic device including the organic thin film or the organic sensor.

According to an embodiment, an organic thin film may include a semiconducting polymer including a ligand that is metal-coordination bondable or is metal-coordination bonded and an elastomer including a ligand that is metal-coordination bondable or is metal-coordination bonded, wherein the semiconducting polymer and the elastomer may be configured to be dynamic intermolecular bonded by a metal-coordination bond.

In some embodiments, the organic thin film may include a matrix including the elastomer and a plurality of nanoparticle-type domains distributed in the matrix. The nanoparticle-type domains may include the semiconducting polymer.

In some embodiments, an amount of the elastomer in the organic thin film may be equal to or greater than an amount of the semiconducting polymer in the organic thin film.

In some embodiments, the semiconducting polymer and the elastomer may be included in a weight ratio of about 1:1 to about 1:10.

In some embodiments, the ligand of the semiconducting polymer and the ligand of the elastomer may be the same or different, and the ligand of the semiconducting polymer and the ligand of the elastomer may independently be a multidentate ligand having a plurality of sites for metal-coordination bonds with different bonding strengths.

In some embodiments, the ligand of the semiconducting polymer and the ligand of the elastomer may be the same or different, and the ligand of the semiconducting polymer and the ligand of the elastomer may independently include a nitrogen-containing heterocyclic moiety and an amide moiety.

In some embodiments, at least one of the ligand of the semiconducting polymer and the ligand of the elastomer may include a pyridine dicarboxamine moiety.

In some embodiments, semiconducting polymer may include a heterocycle, and the heterocycle may include one of N, O, S, Se, Te, or a combination thereof.

In some embodiments, elastomer may include one of a polysiloxane structural unit, a polyamide structural unit, a polyisobutene structural unit, a polyolefin structural unit, a polyester structural unit, a polyurethane structural unit, or a combination thereof.

In some embodiments, the organic thin film may further include a metal ion.

According to another embodiment, an organic sensor may include a plurality of unit devices, wherein each unit device among the unit devices may include a gate electrode, an active layer overlapping with the gate electrode, and a source electrode and a drain electrode electrically connected to the active layer. The active layer may include a semiconducting polymer including a ligand that is metal-coordination bondable or is metal-coordination bonded and an elastomer including a ligand that is metal-coordination bondable or is metal-coordination bonded, and the semiconducting polymer and the elastomer may be configured to be dynamic intermolecular bonded by a metal-coordination bond.

In some embodiments, the active layer may include a matrix, the matrix may include the elastomer and a plurality of nanoparticle-type domains distributed in the matrix, and the nanoparticle-type domains may include the semiconducting polymer.

In some embodiments, an amount of elastomer in the active layer may be equal to or greater than an amount of the semiconducting polymer in the active layer.

In some embodiments, the semiconducting polymer and the elastomer may be included in a weight ratio of about 1:1 to about 1:10.

In some embodiments, the ligand of the semiconducting polymer and the ligand of the elastomer may be the same of different, and the ligand of the semiconducting polymer and the ligand of the elastomer may independently be a multidentate ligand having a plurality of sites for metal-coordination bonds with different bonding strengths.

In some embodiments, the ligand of the semiconducting polymer and the ligand of the elastomer may be the same or different, and the ligand of the semiconducting polymer and the ligand of the elastomer may independently include a nitrogen-containing heterocyclic moiety and an amide moiety.

In some embodiments, at least one of the ligand of the semiconducting polymer and the ligand of the elastomer may include a pyridine dicarboxamine moiety.

In some embodiments, the semiconducting polymer may include a heterocycle, and the heterocycle may include one of N, O, S, Se, Te, or a combination thereof.

In some embodiments, elastomer may include one of a polysiloxane structural unit, a polyamide structural unit, a polyisobutene structural unit, a polyolefin structural unit, a polyester structural unit, a polyurethane structural unit, or a combination thereof.

In some embodiments, the active layer may further include a metal ion.

In some embodiments, the organic sensor may be configured to sense a strain distribution by a change in charge mobilities of the active layers in the plurality of unit devices.

According to another embodiment, an electronic device including the organic thin film or the organic sensor is provided.

A sensing performance and stretchability may be satisfied at the same time.

DETAILED DESCRIPTION

Figure 1:
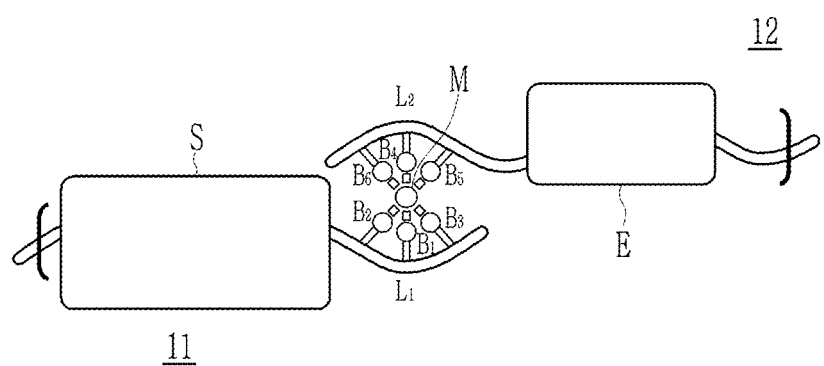
FIG. 1 is a schematic view showing a bond of a semiconducting polymer and an elastomer in an organic thin film according to an embodiment.

Hereinafter, example embodiments of the present disclosure will be described in detail so that a person skilled in the art would understand the same. However, this disclosure may be embodied in many different forms and is not to be construed as limited to the example embodiments set forth herein.

When a definition is not otherwise provided, "substituted" may refer to replacement of hydrogen of a compound by a substituent selected from a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C1 to C20 haloalkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, a C3 to C30 heteroaryl group, and a combination thereof.

As used herein, when a definition is not otherwise provided, "hetero" may refer to inclusion of at least one, for example 1 to 3 heteroatoms selected from N, O, S, Se, Te, Si, and P.

"Heterocycle" may refer to a heterocycloalkyl group and a heteroaryl group.

"Combination thereof" may refer to a mixture, a stack structure, a composite, a copolymer, an alloy, a blend, a reaction product of components.

In Chemical Formulae, "*" may refer to a point of attachment to an atom or a group that may be the same or different.

Hereinafter, an organic thin film according to an embodiment is described.

The organic thin film according to an embodiment includes a plurality of semiconducting polymers, a plurality of elastomers, and a metal ion.

The semiconducting polymer and the elastomer may independently be a linear polymer including at least one structural unit. For example, the semiconducting polymer may be a conjugation polymer having semiconducting characteristics and the elastomer may be a non-conjugation polymer having insulating characteristics.

The semiconducting polymer and the elastomer may include a ligand that is metal-coordination bondable with a metal ion or is metal-coordination bonded with a metal ion in at least one part of one or more structural units. That is, the semiconducting polymer and the elastomer may form metal-ligand coordination complex. The ligand of the semiconducting polymer and the ligand of the elastomer may be the same or different.

The metal ion is not particularly limited as long as it may form a metal-ligand coordination complex and may include, for example, a transition metal ion, a lanthanide metal ion, or a combination thereof, but is not limited thereto.

The ligand of the semiconducting polymer and the ligand of the elastomer may form a metal-ligand coordination bond with the metal ion, respectively, so that the semiconducting polymer and the elastomer may form a dynamic intermolecular bond through a metal-coordination bond. Here, the dynamic intermolecular bond means that a bond between the semiconducting polymer and the elastomer may be easily broken by a stimulus and spontaneously reconstructed to be bonded again. The dynamic intermolecular bond may be, for example, a dynamic intermolecular crosslinking.

FIG. 1 is a schematic view showing a bond of a semiconducting polymer and an elastomer in an organic thin film according to an embodiment.

Referring to FIG. 1, a semiconducting polymer 11 includes a semiconducting moiety (S) having semiconducting characteristics and a ligand ($L_1$) and an elastomer 12 includes an elastic moiety (E) having elasticity and a ligand ($L_2$). The ligand ($L_1$) of the semiconducting polymer 11 and the ligand ($L_2$) of the elastomer 12 may be coordination-bonded with a metal ion (M). The ligand ($L_1$) of the semiconducting polymer 11 and the ligand ($L_2$) of the elastomer 12 may be the same or different.

The ligand ($L_1$) of the semiconducting polymer 11 and the ligand ($L_2$) of the elastomer 12 may be independently a multidentate ligand having a plurality of sites for metal-coordination bonds with different bonding strengths.

For example, the ligand ($L_1$) of the semiconducting polymer 11 may include a first coordination site ($B_1$) forming a strong coordination bond with metal ion (M) and a second coordination site ($B_2$) forming a weak coordination bond with metal ion (M), and optionally, a third coordination site ($B_3$) forming a coordination bond which is stronger than the weaker coordination bond and weaker than the strong coordination bond.

For example, the ligand ($L_2$) of the elastomer 12 may include a fourth coordination site ($B_4$) forming a strong coordination bond with metal ion (M) and a fifth coordination site ($B_5$) forming a weak coordination bond with metal ion (M), and optionally, a sixth coordination site ($B_6$) forming a coordination bond which is stronger than the weak coordination bond and weaker than the strong coordination bond.

As the semiconducting polymer 11 and/or the elastomer 12 include(s) a multidentate ligand, the metal-coordination bond of the semiconducting polymer 11 and/or the metal-coordination bond of the elastomer 12 may be sequentially broken or reconstructed in the order of having the weaker bond strength, so facilitating to provide a dynamic intermolecular bond.

For example, the ligand ($L_1$) of the semiconducting polymer 11 and the ligand ($L_2$) of the elastomer 12 may be the same or different, and may independently include a nitrogen-containing heterocyclic moiety and an amide moiety. The nitrogen-containing heterocyclic moiety may be, for example, pyridine, bipyridine, pyrimidine, bipyrimidine, triazine, bitriazine, or a combination thereof, but is not limited thereto.

For example, the ligand ($L_1$) of the semiconducting polymer 11 and the ligand ($L_2$) of the elastomer 12 may independently include a moiety represented by Chemical Formula A.

[Chemical Formula A]

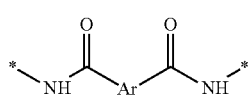

In Chemical Formula A, Ar is a nitrogen-containing heterocycle, for example pyridine, bipyridine, pyrimidine, bipyrimidine, triazine, bitriazine, or a combination thereof, but is not limited thereto.

For example, at least one of the ligand ($L_1$) of the semiconducting polymer 11 and the ligand ($L_2$) of the elastomer 12 may include a pyridine dicarboxamine moiety represented by Chemical Formula A-1.

[Chemical Formula A-1]

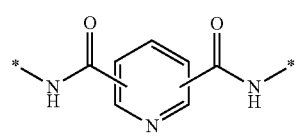

For example the ligand ($L_1$) of the semiconducting polymer 11 and the ligand ($L_2$) of the elastomer 12 may independently include a pyridine dicarboxamine moiety.

Figure 2:
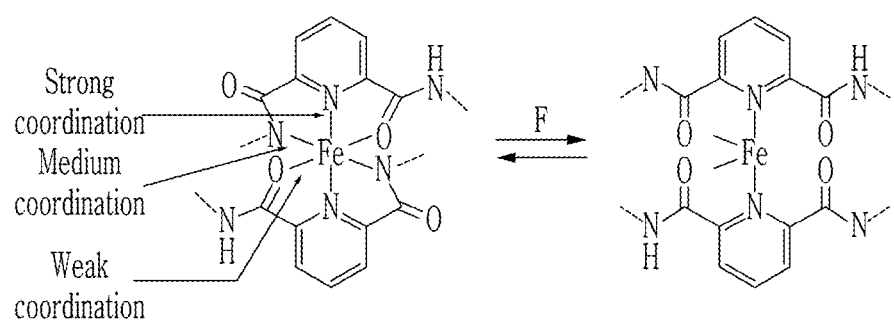
FIG. 2 is a schematic view showing a coordination bond between multiple ligands of a semiconducting polymer and an elastomer according to an embodiment and a metal ion.

FIG. 2 is a schematic view showing a coordination bond between multiple ligands of a semiconducting polymer and an elastomer according to an embodiment and a metal ion.

Referring to FIG. 2, when the ligand ($L_1$) of the semiconducting polymer 11 and the ligand ($L_1$) of the elastomer 12 independently include a pyridine dicarboxamine moiety, the metal ion (M) and the semiconducting polymer 11 and the metal ion (M) and the elastomer 12 may form a multi-bonding with different bonding strengths from each other. For example, in the ligand ($L_1$) of the semiconducting polymer 11, the first coordination site ($B_1$) may be nitrogen (N) in pyridine, the second coordination site ($B_2$) may be oxygen (O) in amide, and the third coordination sites ($B_3$) may be nitrogen (N) in amide. That is, the metal-coordination bond of the semiconducting polymer 11 may include a strong coordination bond between metal ion (M) and nitrogen (N) in pyridine, a weak coordination bond between metal ion (M) and oxygen (O) in amide, and a medium coordination bond between metal ion (M) and nitrogen (N) in amide. Like this, in the ligand ($L_2$) of the elastomer 12, the fourth coordination site ($B_4$) may be nitrogen (N) in pyridine, the fifth coordination site ($B_5$) may be oxygen (O) in amide, and the sixth coordination site ($B_6$) may be nitrogen (N) in amide. In other words, the metal-coordination bond of the elastomer 12 may include a strong coordination bond between metal ion (M) and nitrogen (N) in pyridine, a weak coordination bond between metal ion (M) and oxygen (O) in amide, and a medium coordination bond between metal ion (M) and nitrogen (N) in amide.

Thereby, as the semiconducting polymer 11 and/or the elastomer 12 include(s) a pyridine dicarboxamine moiety as a multidentate ligand, the metal-coordination bond of the semiconducting polymer 11 and/or the metal-coordination bond of the elastomer 12 may be sequentially broken or reconstructed in the order of having the weaker bond strength, so that it may easily form a dynamic intermolecular bond.

The semiconducting moiety (S) of the semiconducting polymer 11 may include at least one conjugation structural unit and the conjugation structural unit may include for example a heterocycle including N, O, S, Se, Te, or a combination thereof. For example, the conjugation structural unit may include, for example furan, thiophene, selenophene, tellurophene, a derivative thereof, a fused ring thereof, or a combination thereof, but is not limited thereto.

For example, the conjugation structural unit of the semiconducting polymer 11 may include for example at least one of moieties represented by Chemical Formulae 1-1 to 1-10, but is not limited thereto.

[Chemical Formula 1-1]

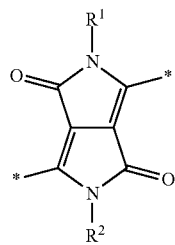

In Chemical Formula 1-1, $R^1$ and $R^2$ may independently be hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, for example at least one of $R^1$ and $R^2$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, and

* may be a point linking with an adjacent moiety,

[Chemical Formula 1-2]

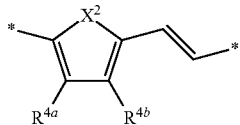

wherein, in Chemical Formula 1-2, $X^1$ may be O, S, Se, or $NR^a$, $R^a$, $R^{3a}$, and $R^{3b}$ may independently be hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, for example at least one of $R^a$, $R^{3a}$, and $R^{3b}$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, and

* may be a point linking with an adjacent moiety,

[Chemical Formula 1-3]

wherein, in Chemical Formula 1-3, $X^2$ may be O, S, Se, or $NR^a$, $R^a$, $R^{4a}$, and $R^{4b}$ may independently be hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, for example $R^a$, at least one of $R^{4a}$ and $R^{4b}$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, and

* may be a point linking with an adjacent moiety,

[Chemical Formula 1-4]

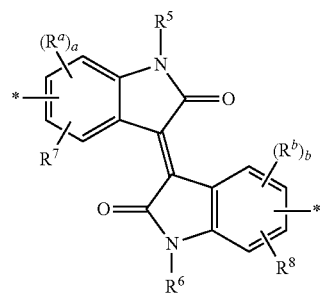

wherein, in Chemical Formula 1-4, $R^5$, $R^6$, $R^7$, and $R^8$ may independently be hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, for example at least one of $R^5$, $R^6$, $R^7$, and $R^8$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, $R^a$ and Rb may be a C1 to C6 alkyl group, a and b may independently be an integer of 0 to 2, and

* may be a point linking with an adjacent moiety,

[Chemical Formula 1-5]

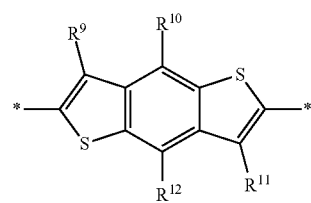

wherein, in Chemical Formula 1-5, $R^9$, $R^{10}$, $R^{11}$, and $R^{12}$ may independently be hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, for example at least one of $R^9$, $R^{10}$, $R^{11}$, and $R^{12}$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, and

* may be a point linking with an adjacent moiety,

[Chemical Formula 1-6]

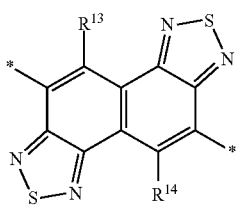

wherein, in Chemical Formula 1-6, $R^{13}$ and $R^{14}$ may independently be hydrogen, a substituted or unsubstituted linear or branched C1 to C50 alkyl group, a substituted or unsubstituted C1 to C50 linear or branched alkoxy group, a substituted or unsubstituted linear or branched C2 to C50 alkenyl group, a substituted or unsubstituted linear or branched C2 to C50 alkynyl group, a substituted or unsubstituted C6 to C30 aryl group, or a combination thereof, for example at least one of $R^{13}$ and $R^{14}$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, and

* may be a point linking with an adjacent moiety,

[Chemical Formula 1-7]

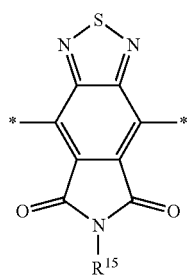

wherein, in Chemical Formula 1-7, $R^{15}$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, and

* may be a point linking with an adjacent moiety,

[Chemical Formula 1-8]

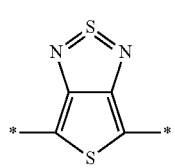

[Chemical Formula 1-9]

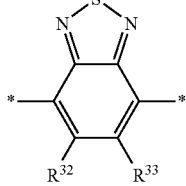

wherein, in Chemical Formula 1-9, $R^{32}$ and $R^{33}$ may independently be hydrogen, a halogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, and

* may be a point linking with an adjacent moiety,

[Chemical Formula 1-10]

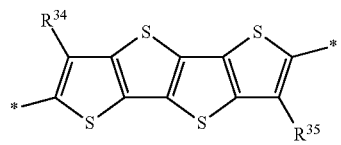

wherein, in Chemical Formula 1-10, $R^{34}$ and $R^{35}$ may independently be hydrogen, a halogen, a substituted or unsubstituted C1 to C40 alkyl group, a substituted or unsubstituted C2 to C40 alkenyl group, a substituted or unsubstituted C2 to C40 alkynyl group, a substituted or unsubstituted C6 to C30 aryl group, or a combination thereof, and

* is a point linking with an adjacent moiety.

For example, the conjugation structural unit of the semiconducting polymer 11 may include, for example a moiety represented by Chemical Formula 2, but is not limited thereto.

[Chemical Formula 2]

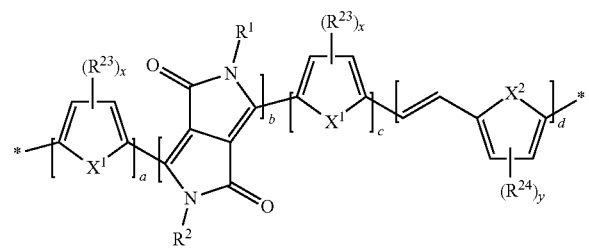

In Chemical Formula 2, $R^1$ and $R^2$ may independently be hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, for example at least one of $R^1$ and $R^2$ may be a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, $X^1$ and $X^2$ may be the same or different and may independently be O, S, Se or $NR^a$ (wherein $R^a$ is hydrogen or a C1 to C6 alkyl group), $R^{23}$ and $R^{24}$ may be the same or different and may independently be hydrogen, a halogen, a substituted or unsubstituted linear or branched C1 to C50 alkyl group, a substituted or unsubstituted C1 to C50 linear or branched alkoxy group, a substituted or unsubstituted linear or branched C2 to C50 alkenyl group, a substituted or unsubstituted linear or branched C2 to C50 alkynyl group, a substituted or unsubstituted C6 to C30 aryl group, or a combination thereof, x and y may be an integer of 0 to 2, a, c, and d may independently be 0 to 10, b may be 1 to 10, and

* may be a point linking with an adjacent moiety.

The elastic moiety (E) of the elastomer 12 may include, for example a polyorganosiloxane structural unit, a polyamide structural unit, a polyisobutene structural unit, a polyolefin structural unit, a polyester structural unit, a polyurethane structural unit, or a combination thereof. For example, the polyorganosiloxane structural unit may be a polyalkylsiloxane structural unit, for example a polydimethylsiloxane (PDMS) structural unit, but is not limited thereto.

The semiconducting polymer 11 and the elastomer 12 may be blended in the organic thin film.

Figure 3:
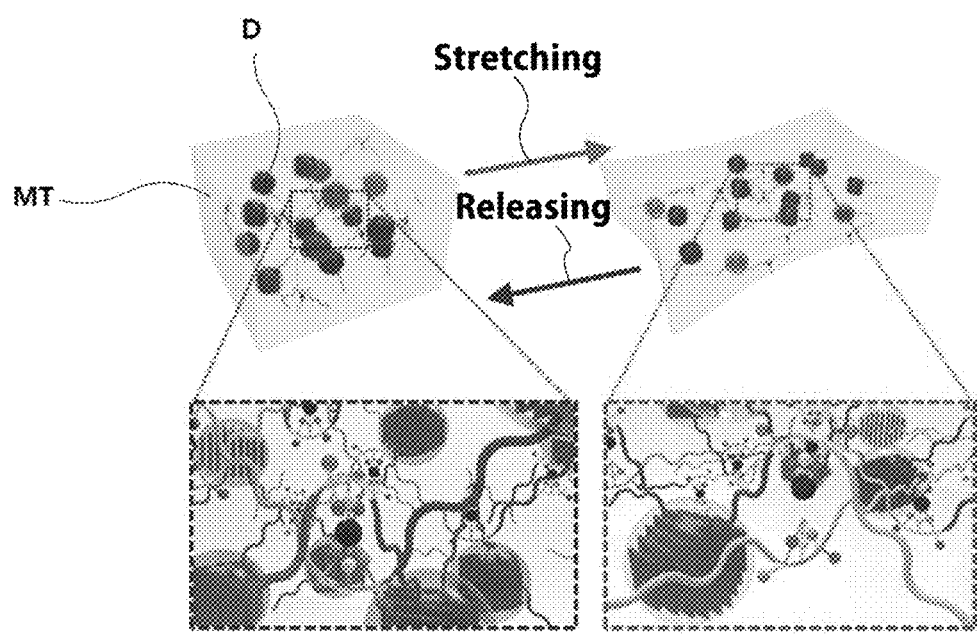
FIG. 3 is a schematic view showing a structure of an organic thin film according to an embodiment and changes according to elongation thereof.

For example, referring to FIG. 3, the organic thin film may include a matrix (MT) including or composed of an elastomer 12 and a plurality of domains (D) including or composed of a semiconducting polymer 11. The plurality of domains (D) may be uniformly or randomly distributed in the matrix (MT). The plurality of domains (D) may be a crystalline structure formed by a phase separation, for example, may be nanoparticle-like phase separation domains. The distribution of the plurality of domains (D) in the matrix (MT) may be changed according to stretching of the organic thin film.

The semiconducting polymer 11 may confer semiconducting characteristics onto the organic thin film, so as to provide a strain-sensitive organic thin film. When the organic thin film receives external physical stimuli or is stretched, charge mobility of the organic thin film may be changed, and strain changes may be detected from changes of charge mobility.

The elastomer 12 may adjust a timing showing a strain-sensitivity (threshold percolation) of the semiconducting polymer 11 by effectively absorbing mechanical strain and may provide elasticity to the organic thin film at the same time, thereby it may provide effective strain-sensitive stretchable organic thin film. For example, as mentioned above, when a plurality of nanoparticle-like phase separation domains are distributed in a matrix including or composed of elastomer 12, each domain may be not contacted directly to each other among adjacent domains because it is surrounded by the matrix, so the strain-sensitivity of the organic thin film may be effectively controlled to provide further effective strain-sensitive stretchable organic thin film.

In addition, the dynamic intermolecular bond through the metal-coordination bond between the semiconducting polymer 11 and the elastomer 12 may confer more improved stretchable characteristics to the organic thin film and also automatically show self-healing characteristics, so that the damaged part may be self-healed at a room temperature within a short time.

The strain sensitivity, stretchable, and self-healing organic thin film may be obtained by associating the semiconducting polymer 11 and the elastomer 12. For example, the elastomer 12 may be included in the same amount as or greater than the semiconducting polymer 11, for example, the semiconducting polymer 11 and the elastomer 12 may be included in the organic thin film at a weight ratio of about 1:1 to about 1:10 or about 1:1 to about 1:5. By including the semiconducting polymer 11 and the elastomer 12 within the range, it may show more effective strain sensitivity, stretchability, and self-healing characteristics.

The organic thin film may be employed for a device requiring strain sensitivity, stretchablity and self-healing characteristics, for example, it may be employed for an organic sensor. The organic sensor may be, for example, a strain sensor sensing strain, and may be a wearable sensor and/or a skin-like sensor.

Hereinafter, the organic sensor according to an embodiment is described.

The organic sensor may include a sensory transistor array composed of a plurality of unit devices, and each unit device includes a gate electrode, an active layer, a source electrode, and a drain electrode. The active layer may be a sensing part of the organic sensor, which may include the above-described organic thin film.

Figure 4:
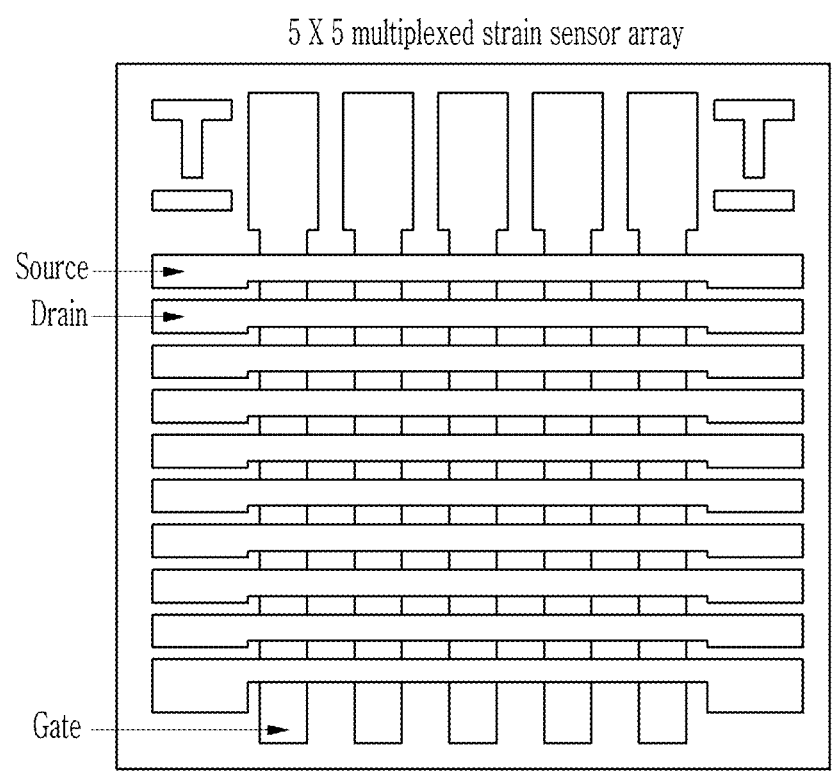
FIG. 4 is a top plan view showing an array of an organic sensor according to an embodiment.
Figure 5:
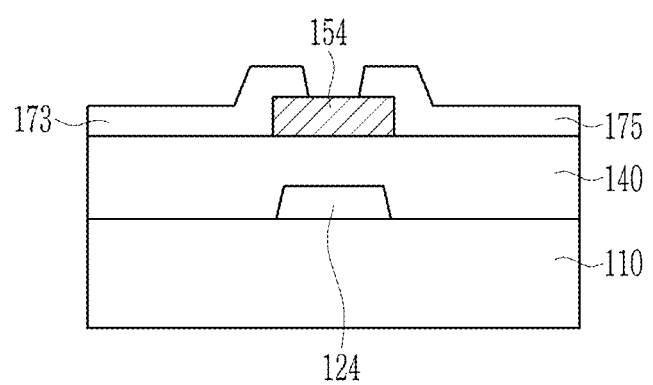
FIG. 5 is a cross-sectional view of a unit device of the organic sensor of FIG. 4.

FIG. 4 is a top plan view showing an array of an organic sensor according to an embodiment, and FIG. 5 is a cross-sectional view of a unit device of the organic sensor of FIG. 4.

Referring to FIGS. 4 and 5, the organic sensor according to an embodiment may include a plurality of lines arranged in row and column directions on a substrate 110, and includes a gate electrode 124, a source electrode 173, and a drain electrode 175 which are electrically connected to each of lines.

A gate electrode 124 is formed on a substrate 110 made of glass, silicon, or a polymer. The gate electrode 124 is connected to a gate line (not shown) transferring a gate signal. The gate electrode 124 may be made of gold (Au), copper (Cu), nickel (Ni), aluminum (Al), molybdenum (Mo), chromium (Cr), tantalum (Ta), titanium (Ti), an alloy thereof, or a combination thereof, but is not limited thereto.

A gate insulating layer 140 is formed on the gate electrode 124. The gate insulating layer 140 may be made of an organic material, an inorganic material, and/or an organic/inorganic material, for example silicon nitride (SiNx), silicon oxide (SiO2), polyorganosiloxane such as polydimethylsiloxane, polyvinylalcohol, polyimide, polyacryl, polystyrene, benzocyclobutane, or a combination thereof, but is not limited thereto.

An active layer 154 is formed on the gate insulating layer 140.

The active layer 154 may include the above-described organic thin film and as described above, it may include a semiconducting polymer, an elastomer, and a metal ion. Details are the same as described above.

A source electrode 173 and a drain electrode 175 are formed on the active layer 154. The source electrode 173 and the drain electrode 175 face each other in the center of the gate electrode 124. The source electrode 173 is connected to a data line for transmitting a data signal. The source electrode 173 and the drain electrode 175 may be made of gold (Au), copper (Cu), nickel (Ni), aluminum (Al), molybdenum (Mo), chromium (Cr), tantalum (Ta), titanium (Ti), an alloy thereof, or a combination thereof, but is not limited thereto.

An encapsulation film (not shown) is formed on the source electrode 173 and the drain electrode 175. The encapsulation film may include an insulating material and may be made of for example an organic material, an inorganic material, and/or an organic/inorganic material. The encapsulation film may prevent or reduce penetration of moisture and contaminants, so that when the organic sensor is attached to the skin, it may limit and/or prevent absorption of sweat and the like and limit and/or prevent deterioration of the device.

Herein, the organic sensor of the bottom gate structure is described as an example of the organic sensor, but the present disclosure is not limited thereto and may be applied to the organic sensor of all known structures such as the organic sensor of a top gate structure.

The organic sensor may be applied to various electronic devices and can be applied to for example flexible and stretchable electronic devices.

The embodiments described above will be described in more detail by way of examples. It is to be understood, however, that the following examples are for illustrative purposes only and are not intended to limit the scope of the claims.

Measurement and Characteristics Analysis

Nuclei magnetic resonance (NMR) spectra are recorded on a VARIAN® MERCURY™ console spectrometer ($^1$H 400 MHz, $^{13}$C 100 MHz). Polymer NMR spectra are recorded at 120° C. in deuterated 1,1,2,2-tetrachloroethane (TCE-d$_2$). Chemical shifts are given in parts per million (ppm) with respect to tetramethylsilane as an internal standard. Number average molecular weight ($M_n$), weight average molecular weight ($M_w$), and polydispersity index (PDI) are evaluated by relatively high temperature size exclusion chromatography (SEC) using 1,2,4-trichlorobenzene and performed under 200° C. on Tosoh High-temperature Eco-SEC equipment equipped with a single TSKgel GPC column (GMH$_{HR}$-H; 300 mm×7.8 mm) also calibrated by monodisperse polystyrene standards. Thermogravimetric analyses (TGA) are performed on a TA Instrument INSTRUMENTS® Q100 (differential scanning calorimeter) and Mettler METTLER-TOLEDO® AG-TGA/SDTA851$^e$ model (thermogravimetric analysis instrument), respectively. Dynamic mechanical analysis (DMA) is performed on TA INSTRUMENTS® Q800 equipment (DMA instrument) equipped with a gas cooling accessory and a fiber/film tension modulus. UV Visible spectroscopy is performed with a UV/Visible/NIR CARY™ 6000i spectrophotometer. The surface structure of the polymer film is obtained with a NANOSCOPE® 3D controller atomic force micrograph (AFM, Digital Instruments) operated in the tapping mode at room temperature. Grazing incidence X-ray diffraction (GIXD) patterns are measured at the Stanford Synchrotron Radiation Lightsource (a research facility) on beamline 11-3 with photon energy of 12.73 keV. To enhance the diffraction intensity and reduce substrate scattering, the angle of incidence is fixed at 0.12°.

All the measurements of the transistors are conducted using a Keithley® 4200 semiconductor parameter analyzer (a semiconductor parameter analyzer sold by Keithley Instruments Inc., Cleveland, Ohio, USA) under a dry N2 (glovebox) and ambient atmosphere at a room temperature.

Material

Commercial reactants are used without additional purification unless stated otherwise. All the solvents used in the reaction are taken out of a solvent purification system. A tris(dibenzylideneacetone)dipalladium (0)-chloroform adduct (Pd$_2$(dba)$_3$.CHCl$_3$) is purchased from Sigma Aldrich and recrystallized following the reported procedure. (E)-1,2-bis(5-(trimethylstannyl)thiophen-2-yl)ethene (TVT) and 3,6-bis(5-bromothiophen-2-yl)-2,5-bis(4-decyltetradecyl)-2,5-dihydropyrrolo[3,4-c]pyrrole-1,4-dione are synthesized according to the previous known methods.

SYNTHESIS EXAMPLES

Synthesis Example 1: Synthesis of Semiconducting Polymer

[Reaction Scheme 1]

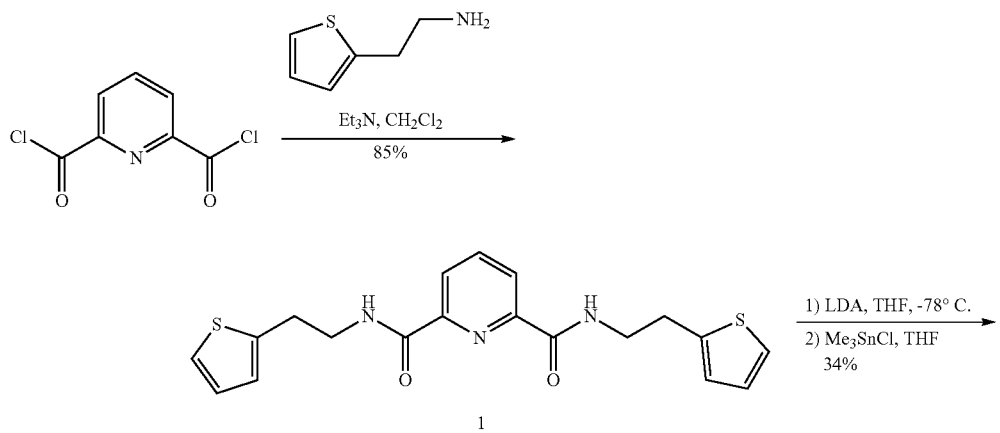

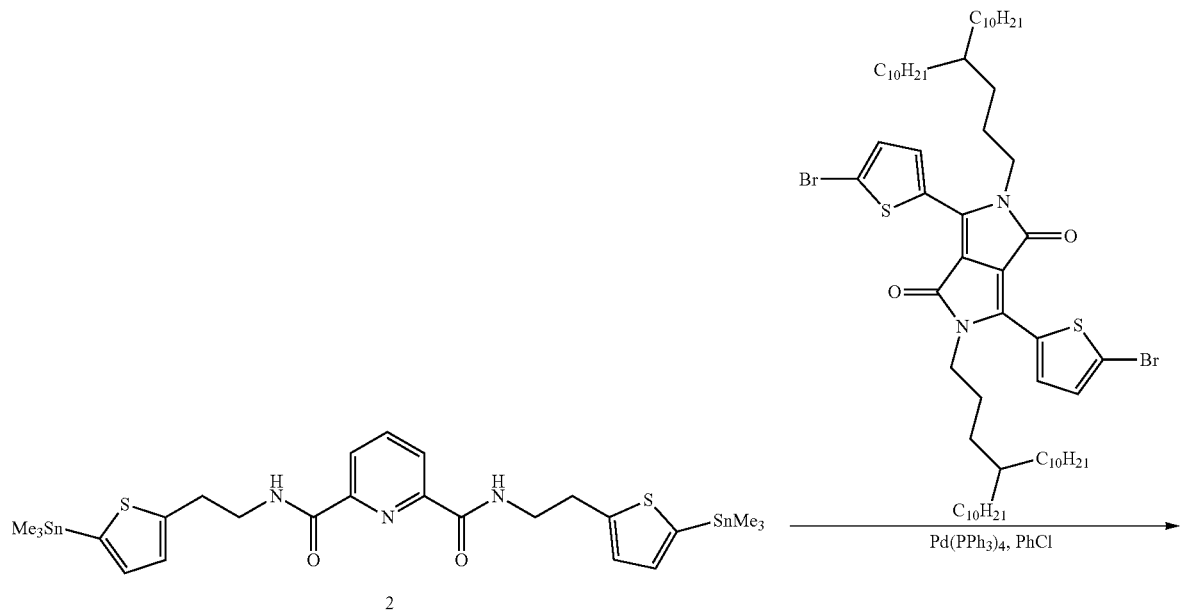
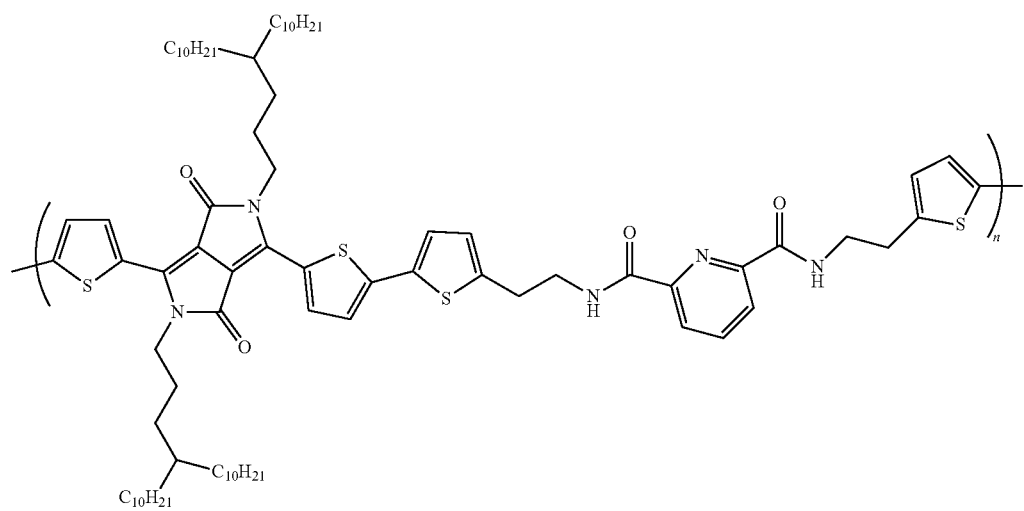
M1

[Reaction Scheme 2]

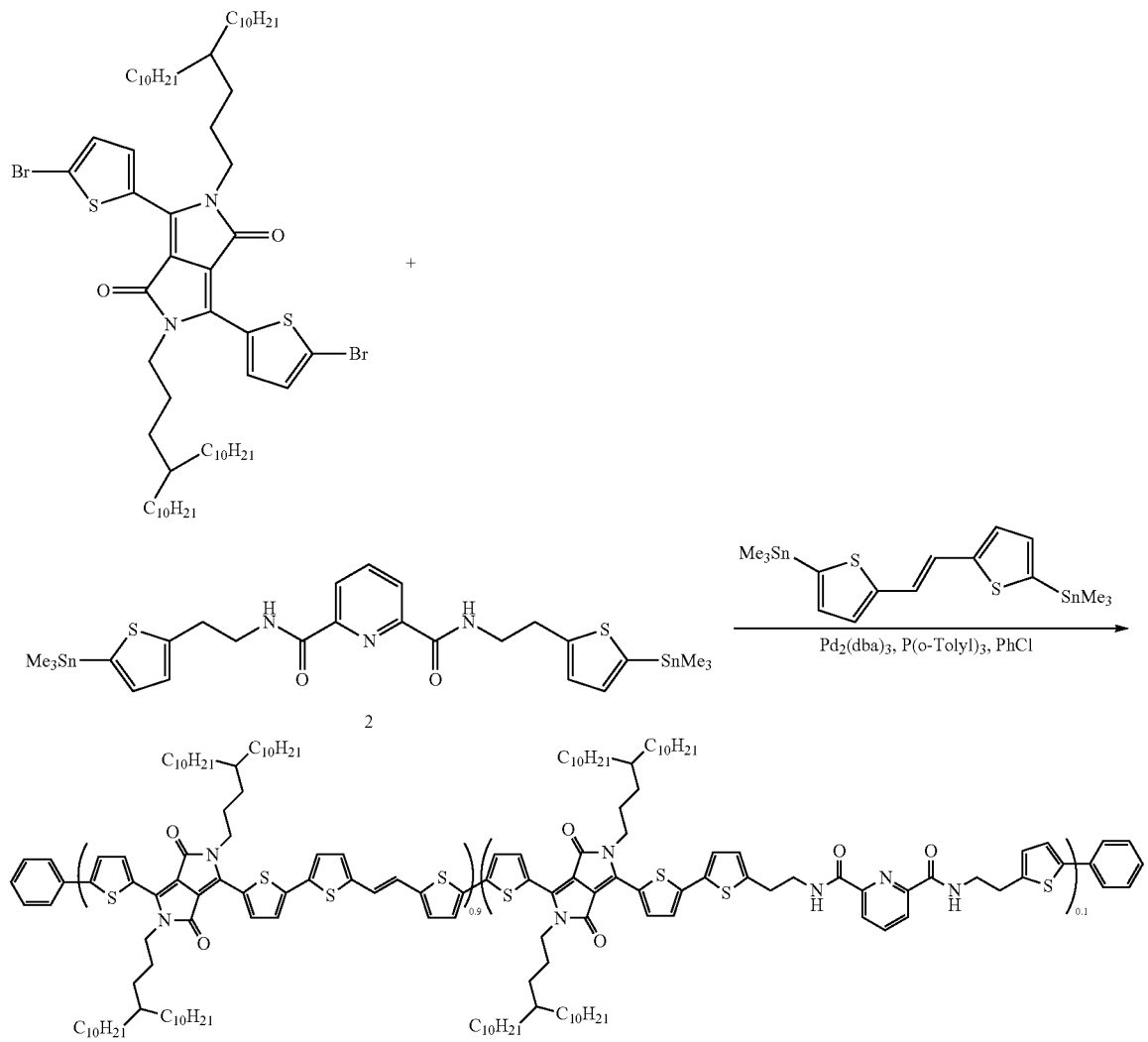

Synthesis of Compound 1

2,6-Pyridine dicarbonyl chloride (3.00 g, 14.7 mmol) and CH$_2$Cl$_2$ (36 mL) are added to a round-bottom flask equipped with a magnetic stir bar. A solution of 2-thiophene ethylamine (4.10 g, 3.78 mmol) and Et$_3$N (6.4 mL) in CH$_2$Cl$_2$ (36 mL) is then dropwise to the previous solution. The mixture is stirred overnight at room temperature and is diluted with CH$_2$Cl$_2$. Upon completion of the reaction, the organic layer is extracted with H$_2$O and is washed with a brine solution. The organic layer is then dried with Na$_2$SO$_4$ to remove a solvent under reduced pressure. The mixture is purified by flash chromatography on silica gel using hexanes to 30% acetone/hexane to afford Compound 1 as a white solid (2.87 g, 85% yield):

$^1$H NMR (400 MHz, CDCl$_3$, 298 K): 8.45 (t, J=6.5 Hz, 2H), 8.29 (d, J=7.3 Hz, 2H), 7.94 (t, J=7.7 Hz, 1H), 7.04 (dd, J=2.6 Hz, 2H), 6.83 (q, J=4.2 Hz, 2H), 6.72 (d, J=2.1 Hz, 2H), 3.62 (q, J=9.0 Hz, 4H), 3.03 (t, J=7.1 Hz); $^{13}$C NMR (100 MHz, CDCl$_3$, 298 K): 163.7, 148.8, 141.3, 139.4, 127.4, 125.8, 125.2, 124.4, 41.1, 30.2.

HRMS (ESI) Calcd for C$_{19}$H$_{19}$N$_3$O$_2$S$_2$ [M+H]$^+$= 386.0991, found 386.0981.

Synthesis of Compound 2

Compound 1 (500 mg, 0.92 mmol) and THF (9 mL) are added to a round-bottom flask equipped with a magnetic stir bar. The solution is cooled to −78° C. and freshly prepared 2.0 M LDA solution in THF (3.9 mL, 7.80 mmol) is added dropwise. The reaction mixture is stirred for 1 h at −78° C. and 1.0 M of SnMe$_3$Cl solution in THF (7.8 mL, 7.8 mmol) is added. The mixture is warmed at room temperature and stirred overnight. The reaction is then quenched with H$_2$O and the organic layer is extracted with CH$_2$Cl$_2$. The organic layer is dried with Na$_2$SO$_4$ and the solvents are removed under reduced pressure. The crude mixture is purified by flash chromatography on basic Al$_2$O$_3$ using 20% acetone/hexane as an eluent to afford Compound 2 as a white solid (468 mg, 34% yield):

$^1$H NMR (CDCl$_3$, 400 MHz, 298 K): 8.35 (d, J=4.0 Hz, 2H), 8.03 (t, J=7.8 Hz, 1H), 7.83 (t, J=5.0 Hz, 2H), 7.02 (d, J=1.7 Hz, 2H), 6.96 (d, J=1.7 Hz, 2H), 3.75 (q, J=9.0 Hz, 4H), 3.21 (t, J=6.9 Hz, 4H), 0.35 (s, 18H); $^{13}$C NMR (100 MHz, CDCl$_3$, 298 K): 163.5, 148.8, 147.0, 139.2, 136.9, 135.3, 127.0, 125.1, 41.1, 30.1, −8.1; HRMS (ESI) Calcd for C$_{25}$H$_{35}$N$_3$O$_2$S$_2$Sn$_2$[M+H]$^+$: 714.0288, found 714.0291.

Synthesis of Compound M1

3,6-bis(5-bromothiophen-2-yl)-2,5-bis(4-decyltetradecyl)-2,5-dihydropyrrolo[3,4-c]pyrrole-1,4-dione (176 mg, 0.16 mmol) and Compound 2 (50.0 mg, 0.07 mmol) are added to a microwave vessel equipped with a stir bar, and subsequently anhydrous chlorobenzene (1 mL) is added thereto. The resulting solution is bubbled with argon for 30 minutes and $Pd(PPh_3)_4$ is quickly added under nitrogen atmosphere. Subsequently, the vessel is sealed with a snap cap and subjected to the following conditions in a microwave reactor (Microwave Setups: CEM Discover Automatic Microwave Reactor; Power, 300 W; Temperature, 180° C.; Time, 155 minutes; Pressure, 250 psi; Stirring, high)

Upon completion of the procedure, the mixture is diluted with $CHCl_3$ and the organic layer is extracted three times with H2O. The organic layer is dried by $Na_2SO_4$ and the solvents are removed under the reduced pressure. The crude mixture is purified by recycling GPC using $CHCl_3$ as an eluent. The medium molecular weight fraction is collected and the solvents are removed under reduced pressure to afford Compound M1 as a deep purple amorphous powder. Molecular weight estimated from MALDI-ToF (positive) for n=2, Calcd for $C_{162}H_{240}N_{10}O_8S_8$ $[M+4H]^{4+}$: 2713.67, found 2714.04.

Synthesis of Semiconducting Polymer (E)-1,2-bis(5-(trimethylstannyl)thiophen-2-yl)ethene (41 mg, 0.080 mmol), 3,6-bis(5-bromothiophen-2-yl)-2,5-bis(4-decyltetradecyl)-2,5-dihydropyrrolo[3,4-c]pyrrole-1,4-dione (100 mg, 0.088 mmol), and Compound 2 (6.0 mg, 0.008 mmol) are added to a microwave vessel equipped with a stir bar, and an anhydrous chlorobenzene (3.5 mL) is added thereto. The resulting solution is bubbled with argon for 30 minutes, followed by quick addition of $Pd_2(dba)_3$ (1.6 mg, 0.002 mmol) and $P(o-tolyl)_3$ (2.2 mg, 0.008 mmol) under nitrogen atmosphere. The vessel is then sealed with a snap cap and subjected to the following conditions in a microwave reactor (Microwave Setups: CEM Discover Automatic Microwave Reactor; Power, 300 W; Temperature, 180° C.; Time, 155 minutes; Pressure, 250 psi; Stirring, high). After completion of the reaction, the polymer is successively end-capped with trimethylphenyl tin (21 mg, 0.088 mmol) and bromobenzene (14 mg, 0.088 mmol). The reaction is cooled to room temperature and the mixture is dissolved in 1,1,2,2-tetrachloroethane (TCE). The polymer is precipitated in methanol and the solid is collected by filtration through a relatively high quality glass thimble. The thimble is left inside a Soxhlet extractor, and the solids are successively extracted with methanol, acetone, hexane, and chloroform. The chloroform fraction is concentrated and precipitated into methanol, yielding fiber-like precipitates. The obtained polymer is filtered and dried in a vacuum oven overnight to obtain a semiconductor polymer.

Synthesis Example 2: Synthesis of Fe-Elastomer

[Reaction Scheme 3]

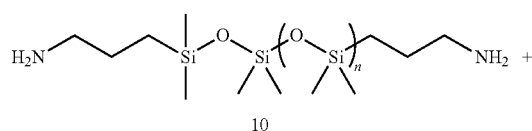

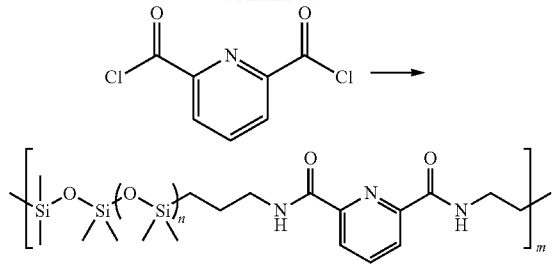

Triethylamine (3.5 ml) is added to a solution of Compound 2 (50 g, $M_n$ 5,000-7,000) in anhydrous $CH_2Cl_2$ (80 ml) at 0° C. under argon atmosphere. After stirring for 2 hours, a solution of 2,6-pyridinedicarbonyl dichloride (2.04 g, 10 mmol) in $CH_2Cl_2$ (20 ml) is added dropwise. Subsequently, the resulting mixture is stirred for 2 hours while the temperature is kept at 0° C. with ice water. The solution is then allowed to warm to room temperature and stirred for 2 days. After reaction, the solution is concentrated to ¼ of its volume, and 60 ml of methanol is poured into it to quench the reaction. White precipitate-like viscous liquid appeared and the mixture is settled for half an hour. and the upper clear solution is then decanted. Subsequently, 20 ml of $CH_2Cl_2$ is added to dissolve the product. Subsequently, the dissolution-precipitation-decantation process is repeated for three times and the final product (elastomer, Mw=108,000) is subjected to vacuum evaporation to remove the solvent and trace of trimethylamine.

Subsequently, a $FeCl_3$ (100 mg/ml) solution in methanol is added to a solution of the obtained elastomer (1 g) in $CH_2Cl_2$ (5 ml) in an amount that a mole ratio of the elastomer and Fe becomes 1:2 to provide a Fe-elastomer.

Manufacture of Organic Thin Film

Preparation Example 1

The semiconductor polymer obtained from Synthesis Example 1 and the Fe-elastomer obtained from Synthesis Example 2 are dissolved in chlorobenzene (18 mg/ml) to prepare a blended solution. In this case, a weight ratio of the semiconductor polymer and the Fe-elastomer is 1:5. Subsequently, the blended solution is stirred on a hot plate of 90° C. for 1 hour and then filtered by a syringe filter (1 μm pore size) to remove microscale particles.

The blended solution is coated on a PDMS substrate and annealed at 150° C. for 10 minutes to provide an organic thin film.

Comparative Preparation Example 1

An organic thin film is manufactured in accordance with the same procedure as in Preparation Example 1, except that the Fe-elastomer is not included.

Evaluation I

The organic thin film according to Preparation Example 1 is evaluated for morphology.

The morphology of the organic thin film is evaluated by a transmission electron microscopy (TEM) and an energy-dispersive X-ray spectroscopy (EDS).

Figure 6:
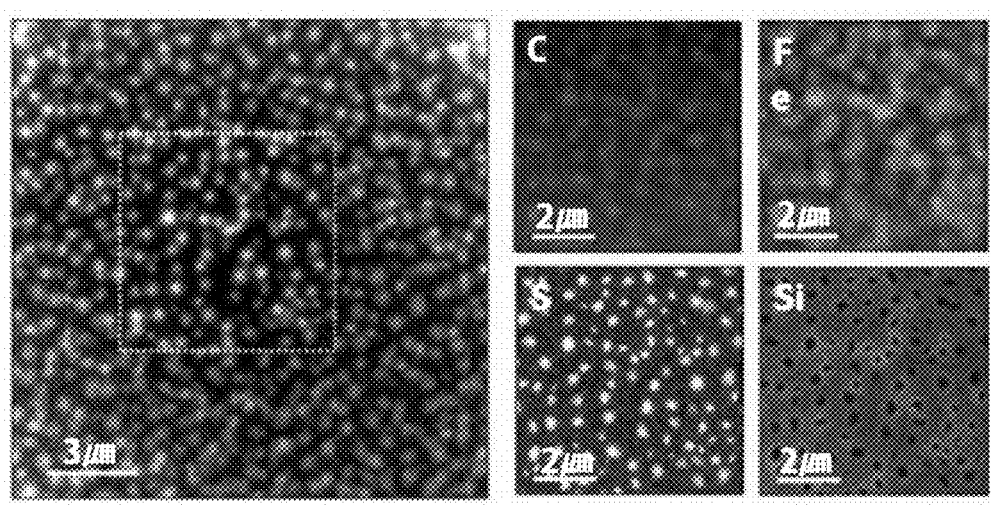
FIG. 6 is a TEM photograph showing a surface morphology of the organic thin film according to Preparation Example 1 and an EDS photograph showing an element mapping.

FIG. 6 is a TEM photograph showing a surface morphology of the organic thin film according to Preparation Example 1 and an EDS photograph showing an element mapping.

Referring to FIG. 6, it is confirmed that the organic thin film according to Preparation Example 1 has a morphology in which a plurality of nanoparticle-like phase separation domains are dispersed in the elastomer matrix.

Evaluation II

The organic thin film according to Preparation Example 1 is evaluated for a strain-stress.

Figure 7:
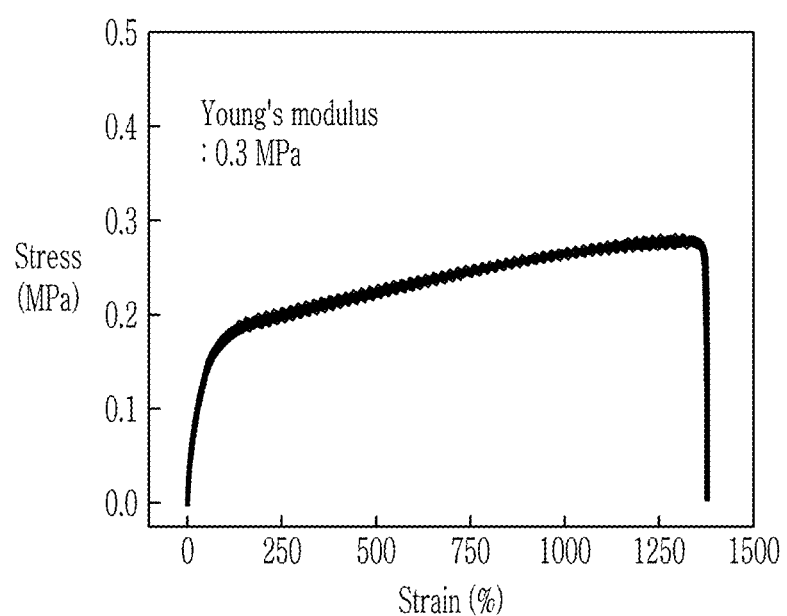
FIG. 7 is a strain-stress curve of the organic thin film according to Preparation Example 1.

FIG. 7 is a strain-stress curve of the organic thin film according to Preparation Example 1.

Referring to FIG. 7, it is confirmed that the organic thin film according to Preparation Example 1 has a high stretchability (strain of greater than or equal to about 1300%) with a high elastic modulus (Young's modulus, about 0.3 MPa). The stretchability and the elastic modulus are similar to human skin, which may be effectively applied for a wearable film.

Evaluation III

The organic thin film according to Preparation Example 1 is performed with a rheology analysis.

Figure 8:
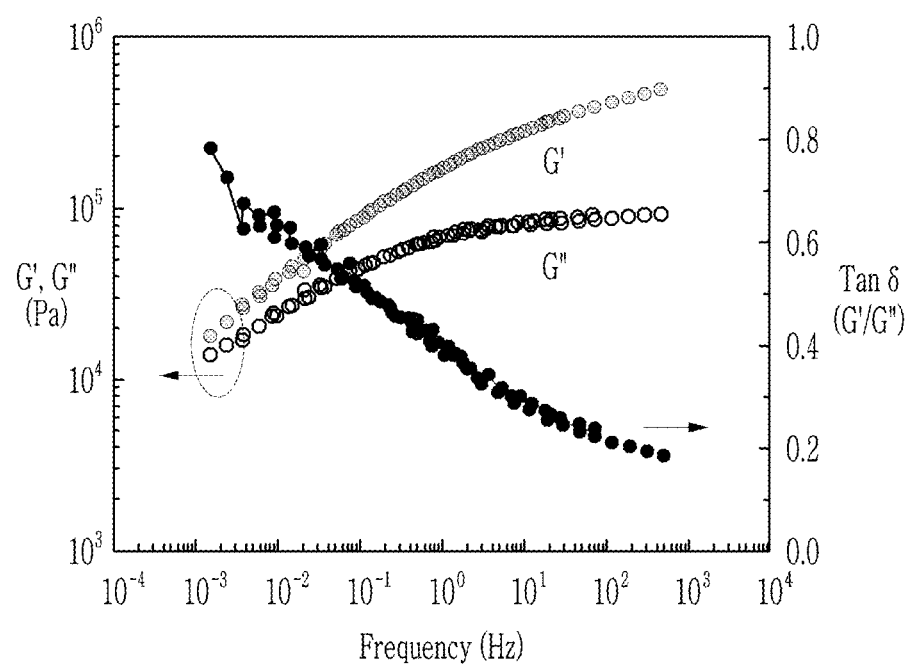
FIG. 8 is a rheology graph of the organic thin film according to Preparation Example 1 at room temperature.
Figure 9:
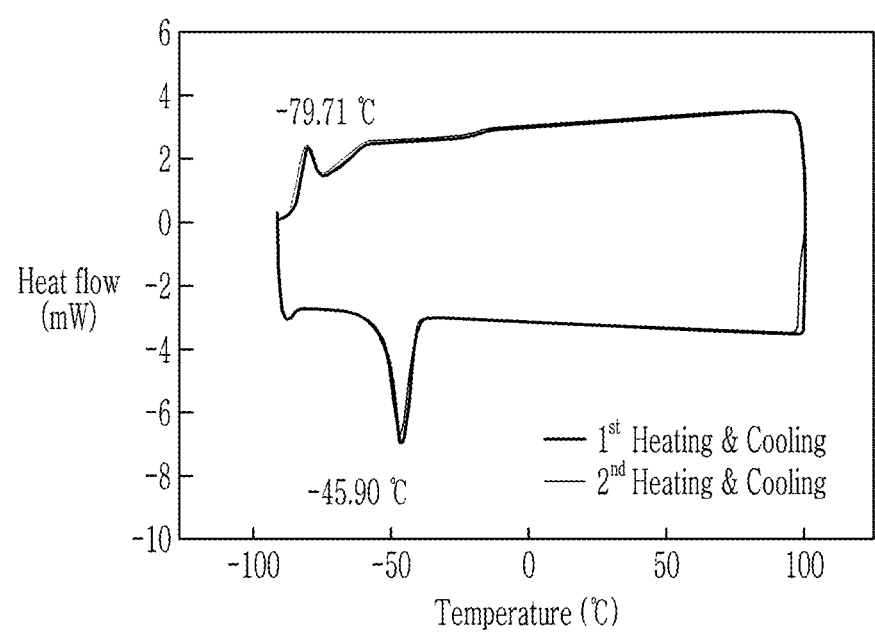
FIG. 9 is a differential scanning calorimetry (DSC) curve of the organic thin film according to Preparation Example 1.

FIG. 8 is a rheology graph of the organic thin film according to Preparation Example 1 at room temperature, and FIG. 9 is a differential scanning calorimetry (DSC) curve of the organic thin film according to Preparation Example 1.

Referring to FIG. 8, it is confirmed that the organic thin film according to Preparation Example 1 has a storage modulus (G') in a range from $10^{-3}$ Hz to $10^{3}$ Hz at a room temperature which is higher than a loss modulus (G"). Thereby, it is confirmed that the organic thin film behaves as a typical cross-linked polymer.

Referring to FIG. 9, it is confirmed that the organic thin film according to Preparation Example 1 has a glass transition temperature (Tg) of about −79° C. Thereby, it is confirmed that the organic thin film has the same thermal characteristics as the silicone-based rubber.

Evaluation IV

The organic thin film according to Preparation Example 1 is evaluated for a stretchability.

Figure 10:
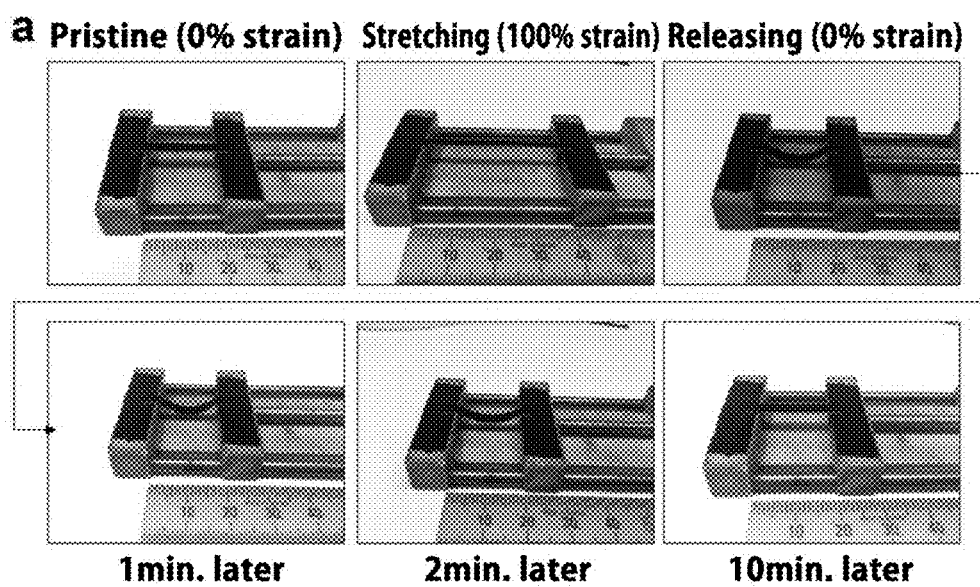
FIG. 10 is a photograph showing a stretching cycle of the organic thin film according to Preparation Example 1.
Figure 11:
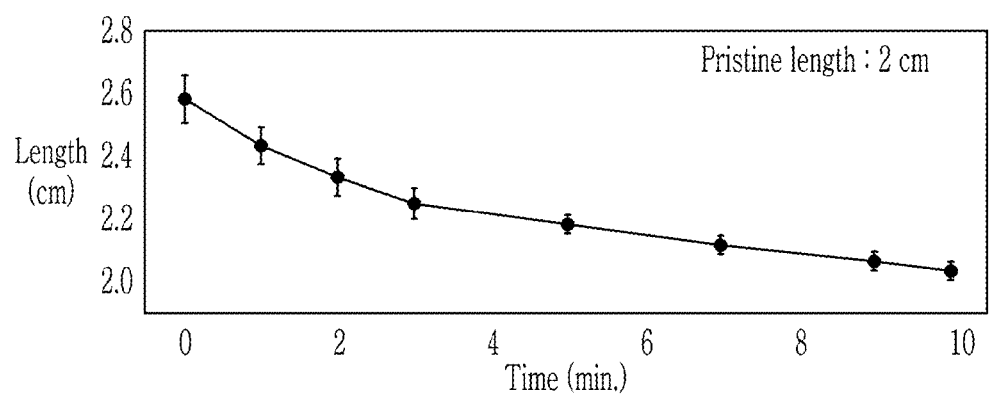
FIG. 11 is a graph showing a change in length when the organic thin film according to Preparation Example 1 is restored after 100% stretching.

FIG. 10 is a photograph showing a stretching cycle of the organic thin film according to Preparation Example 1, and FIG. 11 is a graph showing changes on a length when the organic thin film according to Production Example 1 is restored after being 100% stretched.

Referring to FIG. 11, it is confirmed that the organic thin film according to Preparation Example 1 is restored to the almost initial position within a short time even in the case of stretching the same at 100%.

Evaluation V

Changes on a chain arrangement according to stretching the organic thin films according to Preparation Example 1 and Comparative Preparation Example 1 are monitored.

The changes on a chain arrangement according to stretching the organic thin film may be evaluated from a dichroic ratio ($\alpha_\parallel/\alpha_\perp$) measured by a polarized UV-Vis spectroscopy.

Figure 12:
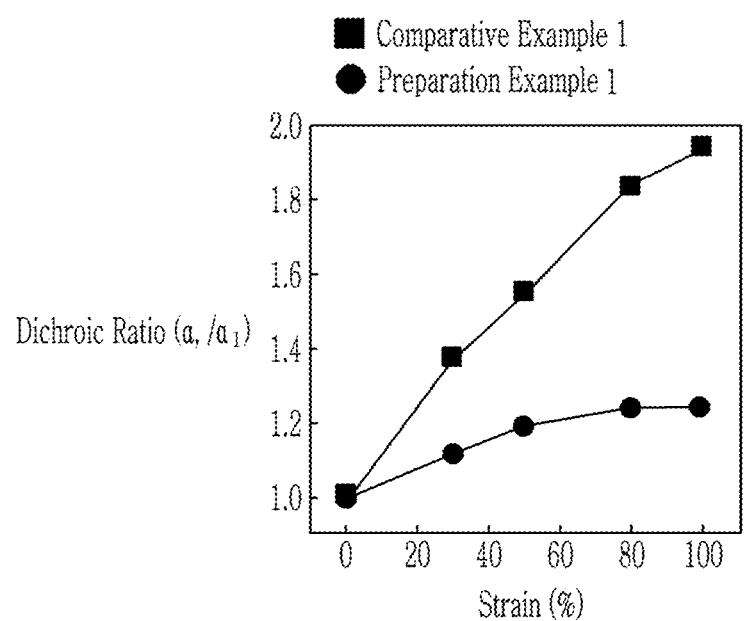
FIG. 12 is a graph showing changes in dichroic ratios depending on strains of the organic thin films according to Preparation Example 1 and Comparative Preparation Example 1.

FIG. 12 is a graph showing changes in dichroic ratios of the organic thin films according to Preparation Example 1 and Comparative Preparation Example 1 depending on a strain.

Referring to FIG. 12, it is confirmed that the organic thin film according to Preparation Example 1 shows that the dichroic ratio is increased until about 50% strain and kept on the constant level until about 100% strain; on the other hand, the organic thin film according to Comparative Preparation Example 1 shows that the dichroic ratio is increased in a high slope according to the change on a strain from 0% to 100%. Thereby, it is confirmed that the organic thin film according to Preparation Example 1 shows that the strain is effectively absorbed by the elastomer, or the strain may be effectively resolved by the energy dispersion mechanism of a dynamic bonding using the metal-ligand interaction.

Evaluation VI

The organic thin film according to Preparation Example 1 is measured for self-healing characteristics.

The self-healing characteristics are evaluated from a recovery rate after cutting an organic thin film with a razor blade and then being allowed to stand at a room temperature for one day.

Figure 13:
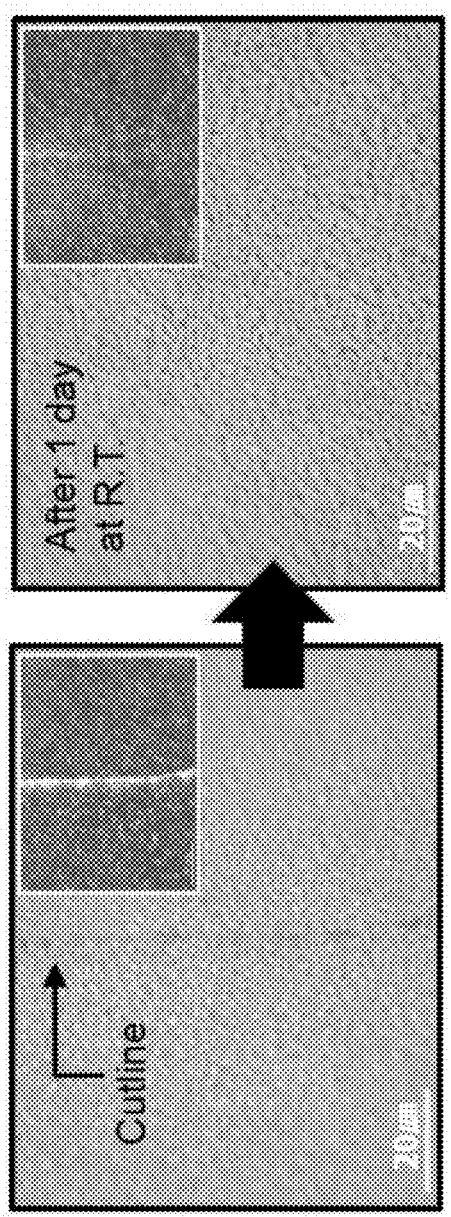
FIG. 13 is a photograph showing self-healing characteristics of the organic thin film according to Preparation Example 1.

FIG. 13 is a photograph showing self-healing characteristics of the organic thin film according to Preparation Example 1.

Referring to FIG. 13, it is confirmed that the damaged part of the organic thin film according to Preparation Example 1 is self-healed at a room temperature after one day.

Manufacture of Organic Sensor I

Example 1

The organic thin film according to Preparation Example 1 (200 nm) is transfer printed on a PDMS elastic substrate and then stretched in a variety of strains (0% to 100%). Subsequently, it is transferred on a $SiO_2/Si$ (highly doped Si) substrate, and then gold (Au) is thermally deposited thereon to provide a source electrode and a drain electrode, so that an organic sensor is manufactured.

Evaluation VII

The organic sensor according to Example 1 is measured for electric characteristics.

Figure 14:
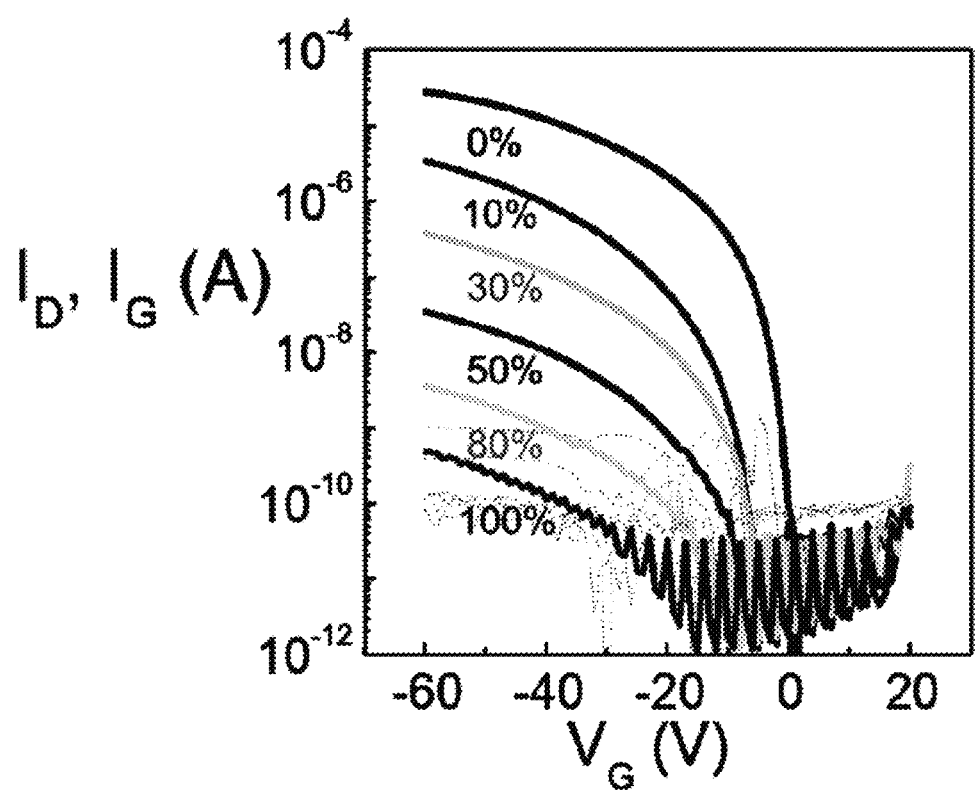
FIG. 14 is an output curve and transfer curve of the organic sensor according to Example 1.

FIG. 14 shows an output curve and a transfer curve of the organic sensor according to Example 1.

Referring to FIG. 14, it is confirmed that the organic sensor according to Example 1 sensitively changes the current characteristic according to a strain, for example, the on-current of the organic sensor may be sensitively changed from $2.79 \times 10^{-5}$ A (0%) to $4.85 \times 10^{-10}$ A (100%).

Figure 15:
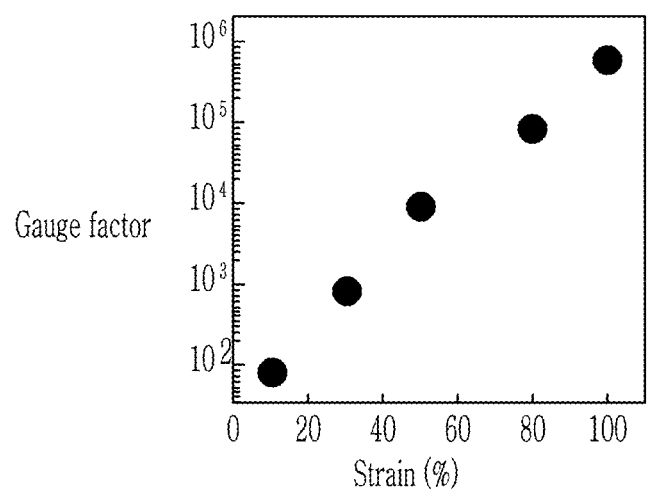
FIG. 15 is a graph showing changes of a gauge factor depending on a strain of the organic sensor according to Example 1.

FIG. 15 is a graph showing changes of a gauge factor of the organic sensor according to Example 1 depending on a strain.

Referring to FIG. 15, it is confirmed that the gauge factor is sensitively changed depending upon the strain of the organic sensor according to Example 1.

Thereby, it is confirmed that the organic sensor according to Example 1 may be effectively employed as a strain-sensitive sensor.

Evaluation VIII

The organic sensor according to Example 1 is measured for a reversibility.

The reversibility of the organic sensor is measured from the change in charge mobility after repeatedly providing a strain to the organic sensor.

Figure 16:
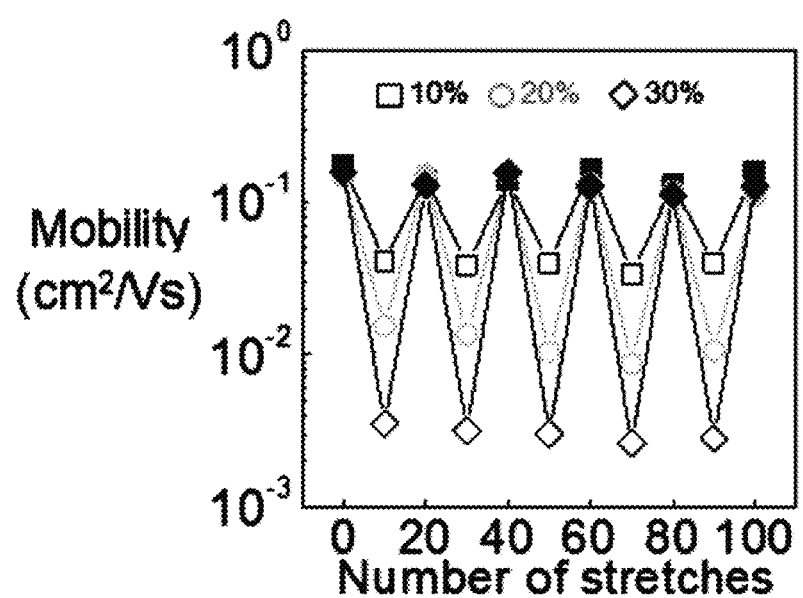
FIG. 16 is a graph showing changes in charge mobility after repeatedly providing strains 10%, 20% and 30% to the organic sensor according to Example 1.

FIG. 16 is a graph showing changes in charge mobility after repeatedly providing strains 10%, 20% and 30% to the organic sensor according to Example 1.

Referring to FIG. 16, it is confirmed that the organic sensor according to Example 1 shows the similar sensing characteristics even on the repeated strains.

Evaluation IX

The organic sensor according to Example 1 is measured for the changes in electric characteristics after damaging the same.

An organic sensor is manufactured in accordance with the same procedure as in Example 1, except that the organic thin film according to Preparation Example 1 is cut by a razor blade instead of the organic thin film according to Preparation Example 1.

The electric characteristics of the organic sensor including the cut organic thin film are compared to the electric characteristics of the organic sensor according to Example 1.

Figure 17:
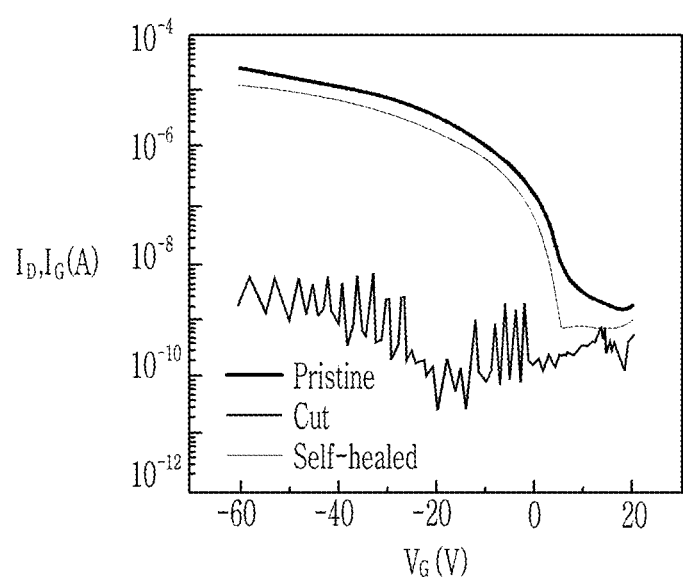
FIG. 17 is a graph showing current characteristics of the organic sensors according to Examples 1 and 4.
Figure 18:
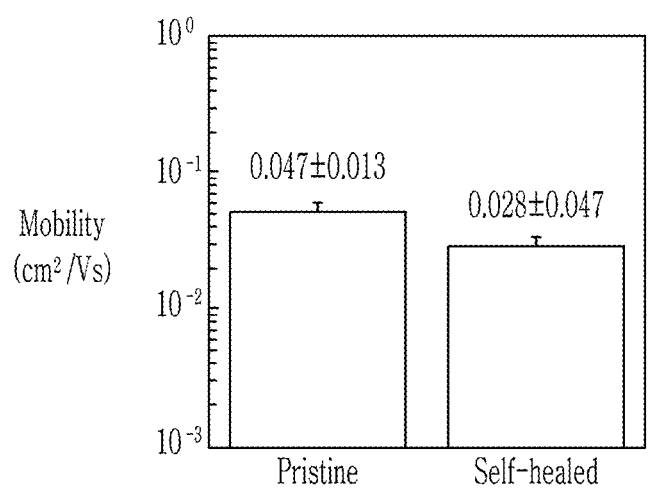
FIG. 18 is a graph showing charge mobility of the organic sensors according to Examples 1 and 4.

FIG. 17 is a graph showing current characteristics of the organic sensor according to Example 1 and the organic sensor including the cut organic thin film, and FIG. 18 is a graph showing the charge mobility of the organic sensor according to Example 1 and the organic sensor including the cut organic thin film.

Referring to FIGS. 17 and 18, it is confirmed that the organic sensor including the cut organic thin film shows almost same electric characteristics as the organic sensor according to Example 1, by self-healing the organic thin film at a room temperature. Thereby, it is confirmed that the organic thin film shows excellent self-healing characteristics.

Manufacture of Organic Sensor II

Organic sensors according to Example 1 are arranged in 5×5 to provide an organic sensor array (W: 1 mm, L: 150p).

Figure 19:
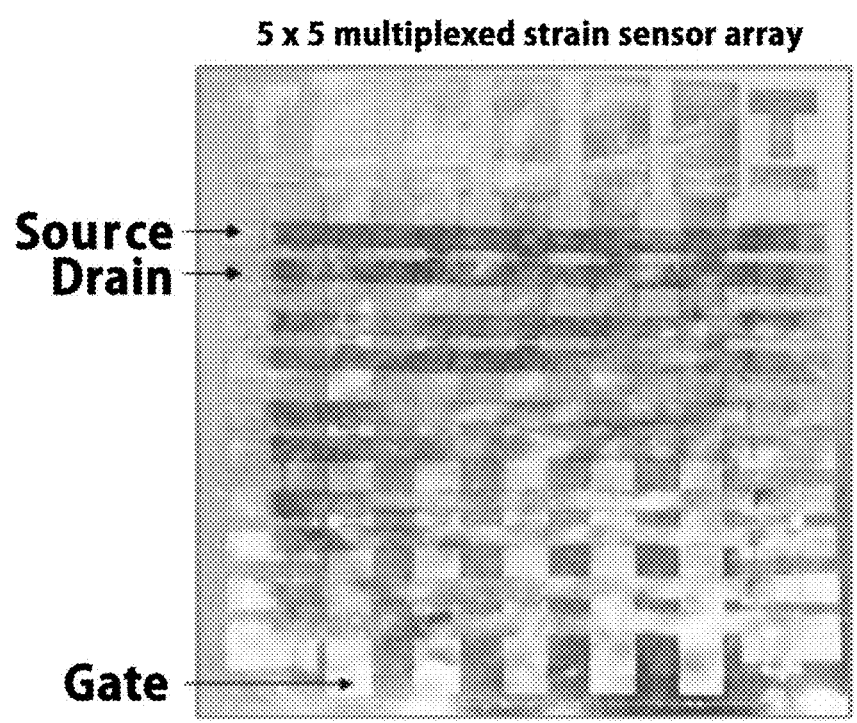
FIG. 19 is a photograph showing an organic sensor array according to an embodiment.
Figure 20:
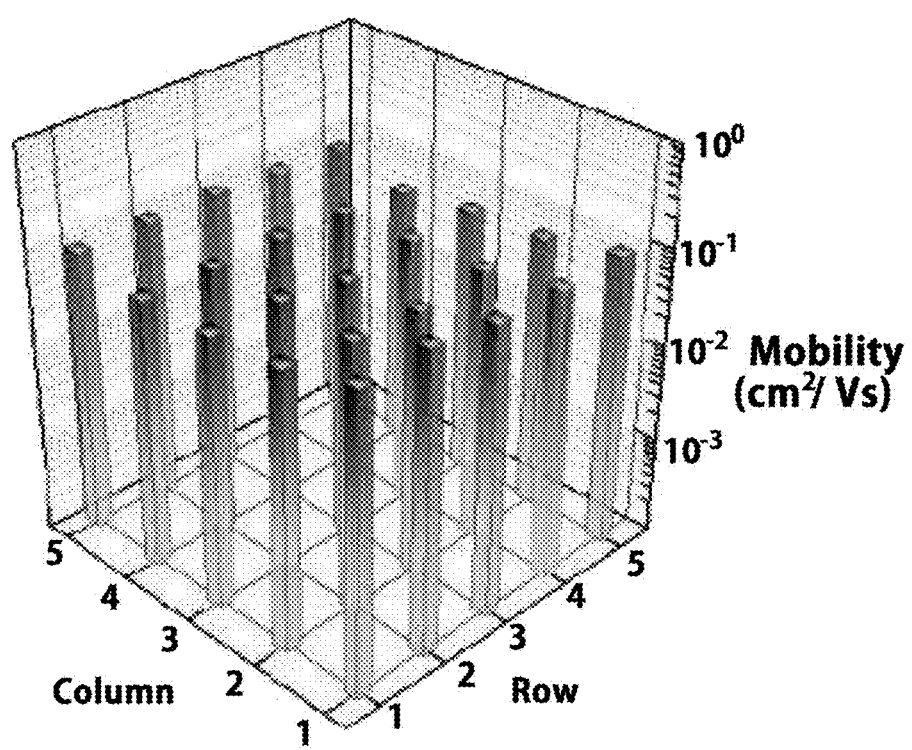
FIG. 20 is a graph showing charge mobility of each unit device of an organic sensor array.

FIG. 19 is a photograph showing an organic sensor array according to an embodiment; and FIG. 20 is a graph showing a charge mobility of each unit device of the organic sensor array.

Referring to FIG. 20, it is confirmed that the organic sensor array shows almost uniform charge mobility.

Figure 21:
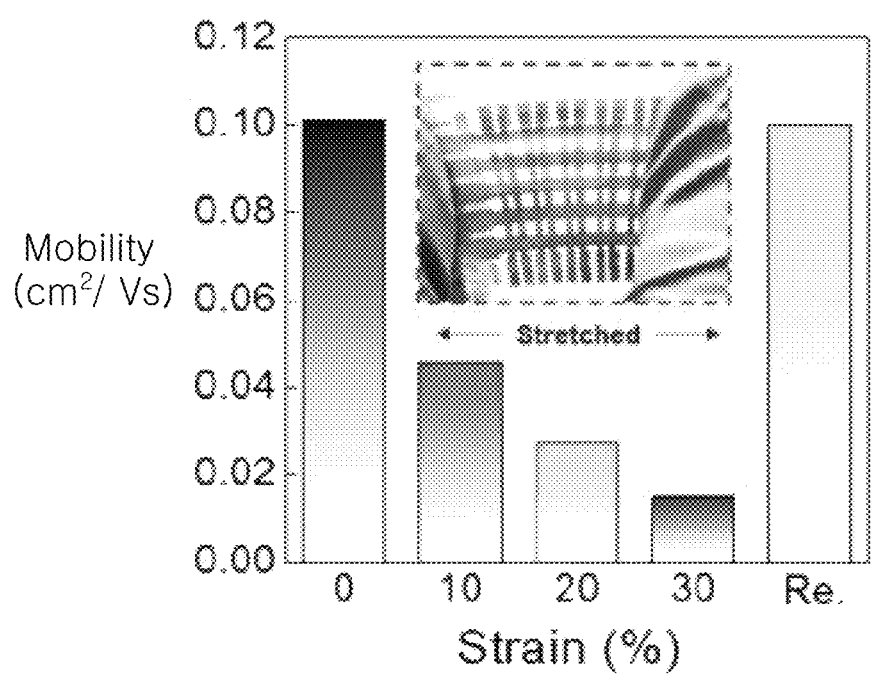
FIG. 21 is a graph showing changes on charge mobility of an organic sensor array depending upon a strain.

In order to confirm a function of the organic sensor array as a strain sensor, the organic sensor array is stretched in one direction as shown in FIG. 21, and then a charge mobility depending upon a strain is monitored.

FIG. 21 is a graph showing changes in charge mobility of the organic sensor array depending upon a strain.

Referring to FIG. 21, it is confirmed that the charge mobility is sensitively changed depending upon a strain of the organic sensor array.

Figure 22:
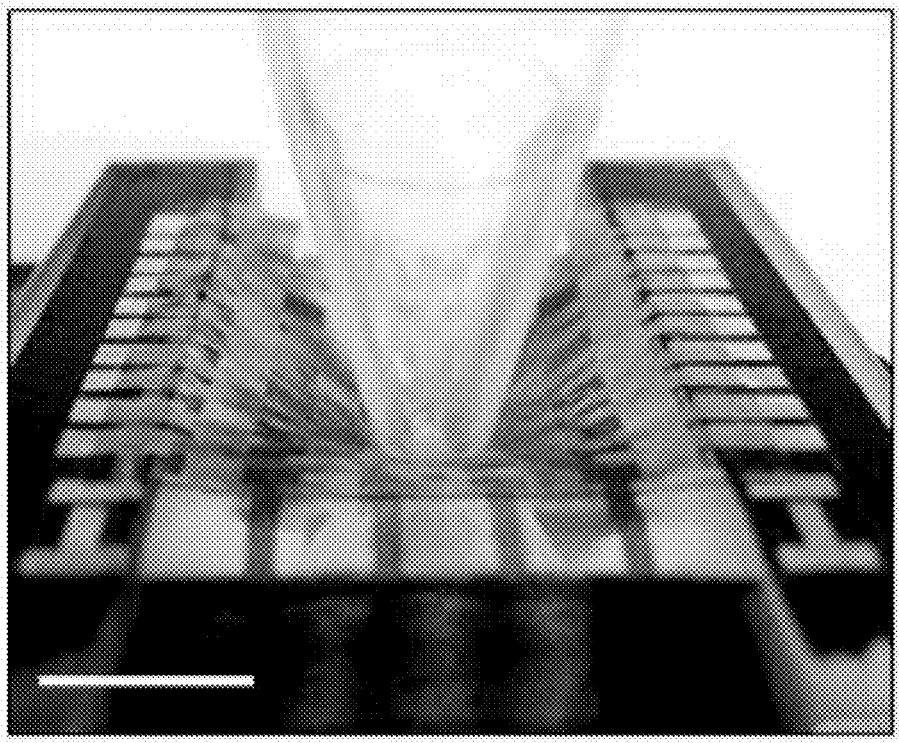
FIG. 22 is a photograph showing a shape of poking a strain of the organic sensor array with a plastic bar.

In order to further confirm a function of the organic sensor array as a strain sensor, the changes in current characteristics and charge mobility depending upon a position are monitored after poking the surface of the organic sensor with a plastic bar as shown in FIG. 22.

Figure 23:
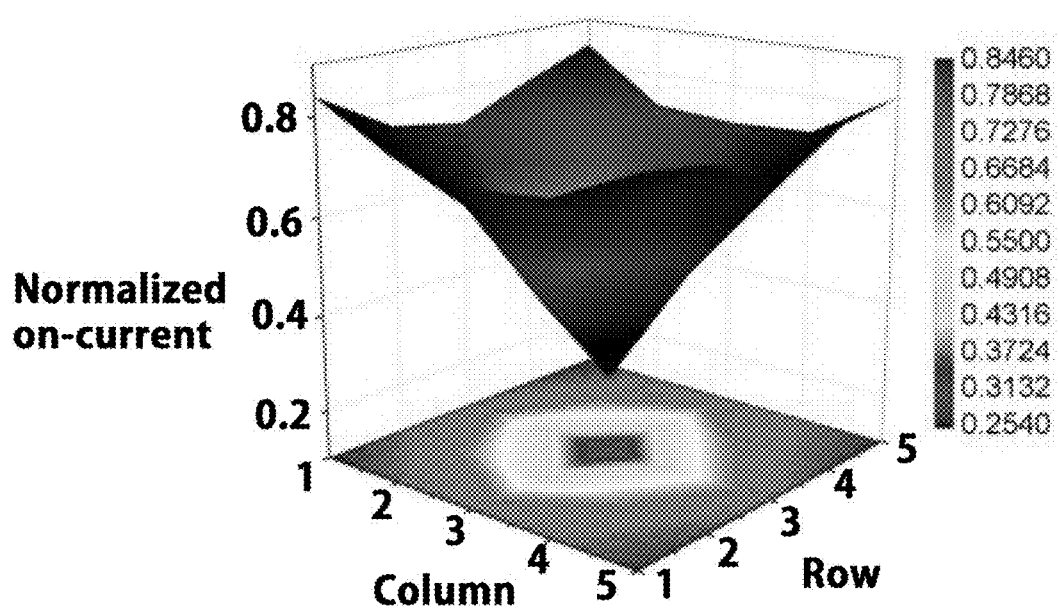
FIG. 23 is a graph showing current characteristics depending upon a position after poking the surface of the organic sensor array with a plastic bar.
Figure 24:
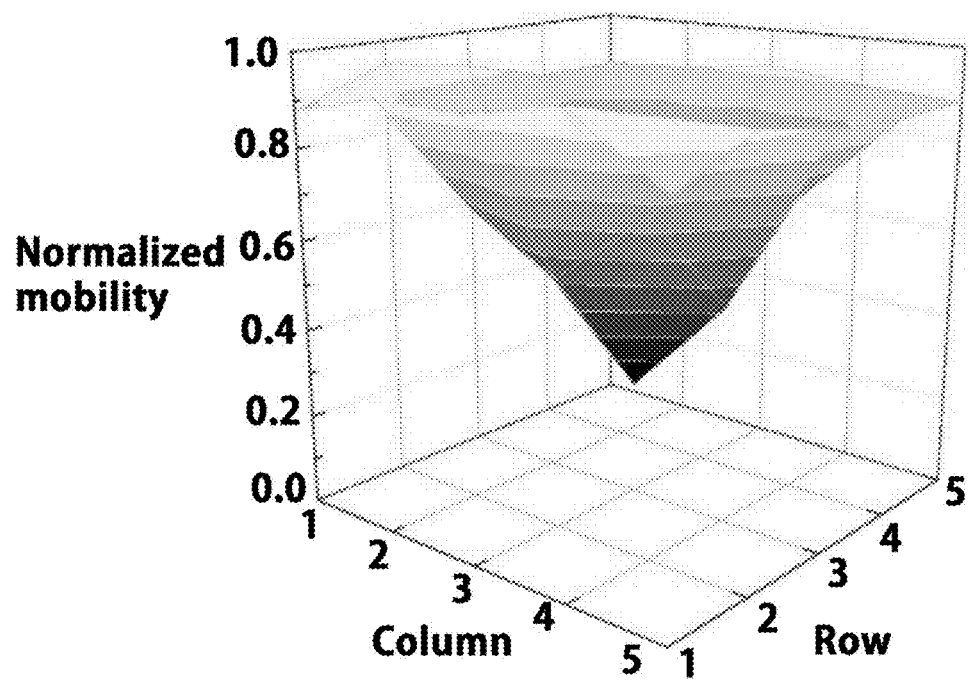
FIG. 24 is a graph showing changes on charge mobility depending upon a position after poking the surface of the organic sensor array with a plastic bar.

FIG. 23 is a graph showing changes in current characteristics depending upon a position after poking the surface of the organic sensor array with a plastic bar, and FIG. 24 is a graph showing changes in charge mobility depending upon a position directly after poking the surface of the organic sensor array with a plastic bar.

Referring to FIGS. 23 and 24, it is confirmed the current characteristic and the charge mobility are sensitively changed depending upon a position of receiving a strain by extraneous stimulus in the organic sensor array. Thus, it is confirmed that the organic sensor array is effectively applicable for a strain sensor, so that the strain distribution may be sensitively detected according to sensitive changes in the current characteristic and the charge mobility.

While this disclosure has been described in connection with what is presently considered to be practical example embodiments, it is to be understood that inventive concepts are not limited to the disclosed embodiments. On the contrary, it is intended to cover various modifications and equivalent arrangements included within the spirit and scope of the appended claims.

What is claimed is:

1. An organic thin film comprising:
a semiconducting polymer including a ligand that is metal-coordination bondable or is metal-coordination bonded, the semiconducting polymer being a conjugation polymer; and
an elastomer including a ligand that is metal-coordination bondable or is metal-coordination bonded,
the semiconducting polymer and the elastomer being configured to be dynamic intermolecular bonded by a metal-coordination bond, wherein
a structure of the semiconducting polymer is different than a structure of the elastomer.

2. The organic thin film of claim 1, comprising:
a matrix, wherein
the matrix includes the elastomer and a plurality of nanoparticle-type domains distributed in the matrix, and
the plurality of nanoparticle-type domains include the semiconducting polymer.

3. The organic thin film of claim 1, wherein
the ligand of the semiconducting polymer and the ligand of the elastomer are the same or different, and
the ligand of the semiconducting polymer and the ligand of the elastomer are independently a multi-dentate ligand having a plurality of sites for metal-coordination bonds with different bonding strengths.

4. The organic thin film of claim 1, wherein
the ligand of the semiconducting polymer and the ligand of the elastomer are the same or different, and
the ligand of the semiconducting polymer and the ligand of the elastomer independently include a nitrogen-containing heterocyclic moiety and an amide moiety.

5. The organic thin film of claim 4, wherein at least one of the ligand of the semiconducting polymer and the ligand of the elastomer includes a pyridine dicarboxamine moiety.

6. The organic thin film of claim 5, wherein
the semiconducting polymer includes at least one conjugation structural unit including one or more moieties represented by Chemical Formulae 1-1 to 1-3 and 1-5 to 1-10:

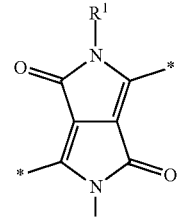

[Chemical Formula 1-1]

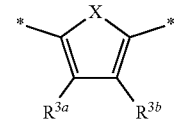

[Chemical Formula 1-2]

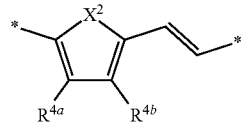

[Chemical Formula 1-3]

-continued

[Chemical Formula 1-5]

[Chemical Formula 1-6]

[Chemical Formula 1-7]

[Chemical Formula 1-8]

[Chemical Formula 1-9]

[Chemical Formula 1-10]

wherein, in Chemical Formula 1,
$R^1$ and $R^2$ independently are hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, and
is a point linking with an adjacent moiety,
wherein, in Chemical Formula 1-2,
$X^1$ is O, S, Se, or $NR^a$,
$R^a$, $R^{3a}$, and $R^{3b}$ independently are hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, and
is a point linking with an adjacent moiety,
wherein, in Chemical Formula 1-3,
$X^2$ is O, S, Se, or $NR^a$,
$R^a$, $R^{4a}$, and $R^{ab}$ independently are hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, and
is a point linking with an adjacent moiety,
wherein, in Chemical Formula 1-5,
$R^9$, $R^{10}$, $R^{11}$, and $R^{12}$ independently are hydrogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, and
is a point linking with an adjacent moiety,
wherein, in Chemical Formula 1-6,
$R^{13}$ and $R^{14}$ independently are hydrogen, a substituted or unsubstituted linear or branched C1 to C50 alkyl group, a substituted or unsubstituted C1 to C50 linear or branched alkoxy group, a substituted or unsubstituted linear or branched C2 to C50 alkenyl group, a substituted or unsubstituted linear or branched C2 to C50 alkynyl group, a substituted or unsubstituted C6 to C30 aryl group, or a combination thereof, and
is a point linking with an adjacent moiety,
wherein, in Chemical Formula 1-7,
$R^{15}$ is a substituted or unsubstituted C10 to C50 linear or branched alkyl group, a substituted or unsubstituted C10 to C50 linear or branched alkoxy group, a substituted or unsubstituted C10 to C50 linear or branched alkenyl group, a substituted or unsubstituted C10 to C50 linear or branched alkynyl group, or a combination thereof, and
is a point linking with an adjacent moiety,
wherein, in Chemical Formula 1-9,
$R^{32}$ and $R^{33}$ independently are hydrogen, a halogen, a substituted or unsubstituted linear or branched C1 to C50 alkyl group, a substituted or unsubstituted linear or branched C1 to C50 alkoxy group, a substituted or unsubstituted linear or branched C2 to C50 alkenyl group, a substituted or unsubstituted linear or branched C2 to C40 alkynyl group, a substituted or unsubstituted C6 to C30 aryl group, or a combination thereof, and
is a point linking with an adjacent moiety,
wherein, in Chemical Formula 1-10,
$R^{34}$ and $R^{35}$ independently are hydrogen, a halogen, a substituted or unsubstituted C1 to C40 alkyl group, a substituted or unsubstituted C2 to C40 alkenyl group, a substituted or unsubstituted C2 to C40 alkynyl group, a substituted or unsubstituted C6 to C30 aryl group, or a combination thereof, and
is a point linking with an adjacent moiety.

7. The organic thin film of claim 1, wherein
the semiconducting polymer includes a heterocycle, and
the heterocycle includes one of N, O, S, Se, Te, or a combination thereof.

8. The organic thin film of claim 1, wherein the elastomer includes one of a polysiloxane structural unit, a polyamide structural unit, a polyisobutene structural unit, a polyolefin structural unit, a polyester structural unit, a polyurethane structural unit, or a combination thereof.

9. The organic thin film of claim 1, further comprising:
a metal ion.

10. An electronic device comprising:
the organic thin film of claim 1.

11. The organic thin film of claim 1, wherein the semiconducting polymer has semiconducting characteristics and the elastomer is a non-conjugation polymer having insulating characteristics.

12. An organic thin film comprising:
a semiconducting polymer including a ligand that is metal-coordination bondable or is metal-coordination bonded; and
an elastomer including a ligand that is metal-coordination bondable or is metal-coordination bonded,
the semiconducting polymer and the elastomer being configured to be dynamic intermolecular bonded by a metal-coordination bond,
wherein an amount of the elastomer in the organic thin film is equal to or greater than an amount of the semiconducting polymer in the organic thin film.

13. The organic thin film of claim 12, wherein the semiconducting polymer and the elastomer are included in a weight ratio of about 1:1 to about 1:10.

14. An organic sensor comprising
a plurality of unit devices, wherein
each unit device among the plurality of unit devices includes a gate electrode, an active layer overlapping with the gate electrode, and a source electrode and a drain electrode electrically connected to the active layer,
the active layer includes an organic thin film,
the organic thin film includes a semiconducting polymer and an elastomer,
the semiconducting polymer includes a ligand that is metal-coordination bondable or is metal-coordination bonded,
the elastomer includes a ligand that is metal-coordination bondable or is metal-coordination bonded, and
the semiconducting polymer and the elastomer are configured to be dynamic intermolecular bonded by a metal-coordination bond.

15. The organic sensor of claim 14, wherein
the active layer includes a matrix,
the matrix includes the elastomer and a plurality of nanoparticle-type domains distributed in the matrix, and
the plurality of nanoparticle-type domains include the semiconducting polymer.

16. The organic sensor of claim 15, wherein an amount of the elastomer in the active layer is equal to or greater than an amount of the semiconducting polymer in the active layer.

17. The organic sensor of claim 16, wherein the semiconducting polymer and the elastomer are included in a weight ratio of about 1:1 to about 1:10.

18. The organic sensor of claim 14, wherein
the ligand of the semiconducting polymer and the ligand of the elastomer are the same or different, and
the ligand of the semiconducting polymer and the ligand of the elastomer independently are a multidentate ligand having a plurality of sites for metal-coordination bonds with different bonding strengths.

19. The organic sensor of claim 14, wherein
the ligand of the semiconducting polymer and the ligand of the elastomer are the same or different, and
the ligand of the semiconducting polymer and the ligand of the elastomer independently include a nitrogen-containing heterocyclic moiety and an amide moiety.

20. The organic sensor of claim 19, wherein at least one of the ligand of the semiconducting polymer and the ligand of the elastomer includes a pyridine dicarboxamine moiety.

21. The organic sensor of claim 20, wherein
the semiconducting polymer includes a heterocycle, and
the heterocycle includes one of N, O, S, Se, Te, or a combination thereof.

22. The organic sensor of claim 21, wherein the elastomer includes one of a polysiloxane structural unit, a polyamide structural unit, a polyisobutene structural unit, a polyolefin structural unit, a polyester structural unit, a polyurethane structural unit, or a combination thereof.

23. The organic sensor of claim 14, wherein the active layer further includes a metal ion.

24. The organic sensor of claim 14, wherein the organic sensor is configured to sense a strain distribution by a change in charge mobility of the active layers in the plurality of unit devices.

25. An electronic device comprising:
the organic sensor of claim 14.

* * * * *